(12) United States Patent
Sciaini et al.

(10) Patent No.: US 12,283,459 B2
(45) Date of Patent: Apr. 22, 2025

(54) NANOFLUIDIC CELL AND LOADING PLATFORM

(71) Applicants: Germán Sciaini, Waterloo (CA); Ariel Petruk, Waterloo (CA)

(72) Inventors: Germán Sciaini, Waterloo (CA); Ariel Petruk, Waterloo (CA)

(*) Notice: Subject to any disclaimer, the term of this patent is extended or adjusted under 35 U.S.C. 154(b) by 232 days.

(21) Appl. No.: 17/428,876

(22) PCT Filed: Feb. 5, 2020

(86) PCT No.: PCT/CA2020/050144
§ 371 (c)(1),
(2) Date: Aug. 5, 2021

(87) PCT Pub. No.: WO2020/160661
PCT Pub. Date: Aug. 13, 2020

(65) Prior Publication Data
US 2022/0102110 A1    Mar. 31, 2022

Related U.S. Application Data

(60) Provisional application No. 62/801,327, filed on Feb. 5, 2019.

(51) Int. Cl.
*H01J 37/16* (2006.01)
*H01J 37/20* (2006.01)
*H01J 37/22* (2006.01)
*H01J 37/26* (2006.01)

(52) U.S. Cl.
CPC ........... *H01J 37/261* (2013.01); *H01J 37/16* (2013.01); *H01J 37/20* (2013.01); *H01J 37/226* (2013.01)

(58) Field of Classification Search
CPC ........ H01J 37/261; H01J 37/16; H01J 37/226; H01J 37/20
See application file for complete search history.

(56) References Cited

U.S. PATENT DOCUMENTS

| | | | |
|---|---|---|---|
| 9,324,539 B2 * | 4/2016 | Damiano, Jr. | H01J 37/16 |
| 2010/0193398 A1 * | 8/2010 | Marsh | H01J 37/20 29/428 |
| 2012/0182548 A1 * | 7/2012 | Harb | G01N 21/05 156/182 |
| 2014/0268321 A1 * | 9/2014 | Damiano, Jr. | H01J 37/20 356/244 |
| 2017/0207062 A1 * | 7/2017 | Dufresne | H01J 37/26 |

FOREIGN PATENT DOCUMENTS

| | | | | |
|---|---|---|---|---|
| CA | 2768873 A1 | | 1/2011 | |
| CN | 106324000 A | * | 1/2017 | ............. G01N 23/04 |
| EP | 3125271 A1 | * | 2/2017 | ........ B01L 3/502723 |

\* cited by examiner

*Primary Examiner* — David E Smith

(57) ABSTRACT

Parts of a pair, in use, are disposed in abutting relation to one another to define a cell for use with an electron microscope, the cell having, disposed on opposite surfaces thereof, a pair of windows, the windows being arranged in spaced relation to one another to define a viewable interior volume of the cell at a region of overlap. A housing is adapted to receive one of the pair of parts and further adapted to define a chamber containing the one of the parts which chamber, in use, is evacuated. An arrangement is adapted, when the one of the parts is received by the housing and is in receipt of a sample and the chamber is evacuated, to position together the one of the pair of parts and the other of the pair of parts.

18 Claims, 44 Drawing Sheets

NANOFLUIDIC CELL AND LOADING PLATFORM

FIELD

The invention relates to the field of electron microscopy.

BACKGROUND

It is well known to study in-liquid samples using a nanofluidic cell (NFC) placed within an electron microscope, but known methods suffer from, inter alia, poor reproducibility.

SUMMARY OF THE INVENTION

Forming one aspect of the invention is apparatus for use with an electron microscope and for receiving a liquid sample and/or an in-liquid sample droplet. The apparatus comprises: a pair of parts which, in use, are disposed in abutting relation to one another to define a cell for use with said microscope, the cell having: disposed on opposite surfaces thereof, a pair of windows, the windows being arranged in spaced relation to one another to define: a viewable interior volume of the cell at a region of overlap; and a cavity communicating with the viewable interior volume of the cell, the volume of the cavity, in combination with the viewable interior volume, being larger than the volume of the droplet.

According to another aspect of the invention, each part of the pair can be defined, at least in part, by a respective body, each body defining a respective one of the windows.

According to another aspect of the invention, one of the bodies can define a surface in which the window of such body is defined.

According to another aspect of the invention, the surface can be one or more of the end of a boss and a surface having a high affinity for the liquid.

According to another aspect of the invention, the pair of parts can further comprise a compressible seal, the seal: being disposed between the bodies and in compression in the cell; and defining, in part, the cavity.

According to another aspect of the invention, the seal can be an O-ring.

According to another aspect of the invention, the pair of parts can further comprise a coating disposed on one or both of the bodies and sealing the bodies together to seal the cavity in use.

According to another aspect of the invention, each of the bodies can terminate in a flat surface, the flat surfaces abutting one another in use to define a seal which seals the cavity in use.

According to another aspect of the invention, each body can be a silicon body.

According to another aspect of the invention, each window can be a high electron transparent window.

According to another aspect of the invention, the boss can terminate in a round surface.

Forming another aspect of the invention is apparatus for use with a pair of parts, a supply of liquid and an evacuation apparatus, the pair of parts, in use, being disposed in abutting relation to one another to define a cell for use with a microscope. This apparatus comprises a housing and an arrangement.

The housing has a receiver for one of the pair of parts, the housing being adapted to permit, when the one of the pair of parts is in the receiver, a sample of liquid from the supply to be placed upon the one of the pair, the housing further being adapted to define a chamber containing the one of the parts which chamber, in use, is evacuated by the evacuation apparatus.

The arrangement, when the one of the parts is in the receiver and is in receipt of the sample and the chamber is under said vacuum conditions, positions the pair of parts relative to one another such that the other of the pair of parts is disposed upon the one of the pair of parts.

According to another aspect of the invention, the apparatus can further comprise a mechanism for, when the one of the parts is in the receiver and the chamber is under vacuum, depositing a sample of said liquid on said one of the parts.

According to another aspect of the invention, the housing can comprise: a base defining the receiver; and a cover. The cover has, with the base, a closed configuration, wherein the cover is disposed in abutting, sealed relation to the base; and an open configuration, wherein the cover is disposed above and in spaced relation to the base, to permit placement of the one of the pair of parts in the receiver. This cover defines, when the one of the parts is in the receiver and the cover is in the closed configuration with the base, in combination with the base, the chamber.

According to another aspect of the invention, the mechanism can comprise a needle mounted to the cover for movement between: an extended position wherein a tip of the needle is positioned immediately above the one of the pair of parts to permit a sample of the liquid to be placed thereupon; and a retracted position wherein the tip of the needle is spaced from the one of the pair of parts.

According to another aspect of the invention, the needle can form part of a syringe mounted for reciprocation to the cover for movement between the extended position and the retracted position.

According to another aspect of the invention, the arrangement can comprise a carrier adapted to releasably grip the other of the pair of parts and mounted to the housing for movement between: a retracted position, vertically spaced above the one of the parts sufficiently to allow movement of the needle from the retracted position to the extended position; and an extended position, whereat the other of the parts is disposed in abutting relation to the one of the parts.

According to another aspect of the invention, the arrangement can comprise a carrier in receipt of the one of the pair of parts or the other of the pair of parts and mounted to the housing for movement between: a retracted position, whereat the parts of the pair are disposed in vertically spaced relation to one another; and an extended position, whereat the parts of the pair are disposed in abutting relation to one another.

According to another aspect of the invention, the carrier can be adapted to releasably grip the other of the pair of parts by a low-tack adhesive.

According to another aspect the invention, the base and cover can be transparent.

Apparatus for use with a pair of parts and an evacuation apparatus forms another aspect of the invention. The parts, in use, are disposed in abutting relation to one another to define a cell for use with an electron microscope. This apparatus comprises a housing and an arrangement. The housing is adapted to receive one of the pair of parts and is further adapted to define a chamber containing the one of the parts which chamber, in use, is evacuated by the evacuation apparatus. The arrangement is for, when the one of the parts is received by the housing and is in receipt of a sample of the liquid and the chamber is under said vacuum conditions, positioning the pair of parts relative to one another such that the other of the pair of parts is disposed upon the one of the pair of parts.

Advantages, features and characteristics of the invention will become apparent upon a review of the following detailed description with reference to the appended drawings, the latter being briefly described hereinafter.

DETAILED DESCRIPTION

Figure 1:
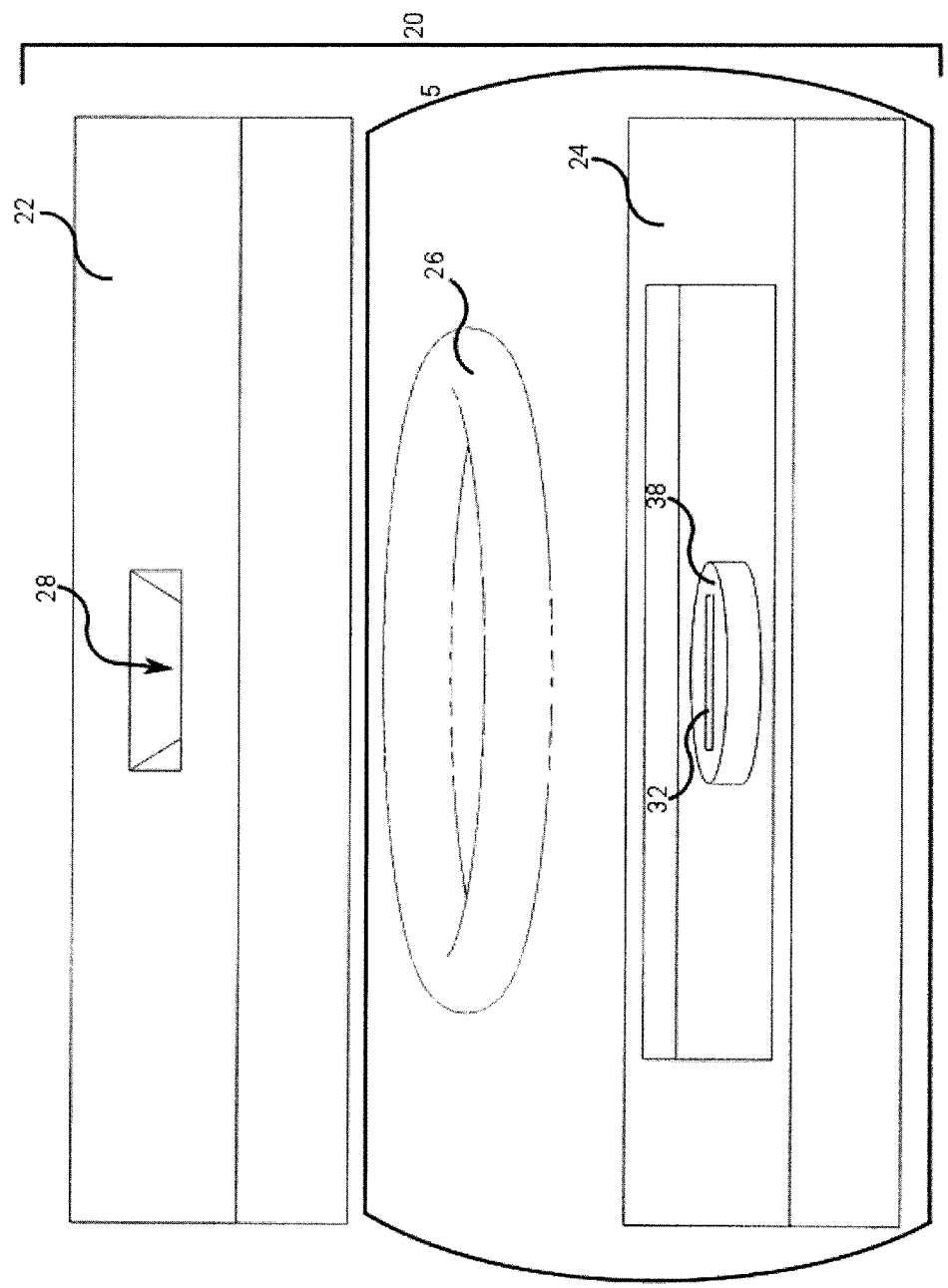
FIG. 1 is a view of an exemplary embodiment of the inventive apparatus for use with an electron microscope and for receiving a sample.
Figure 2:
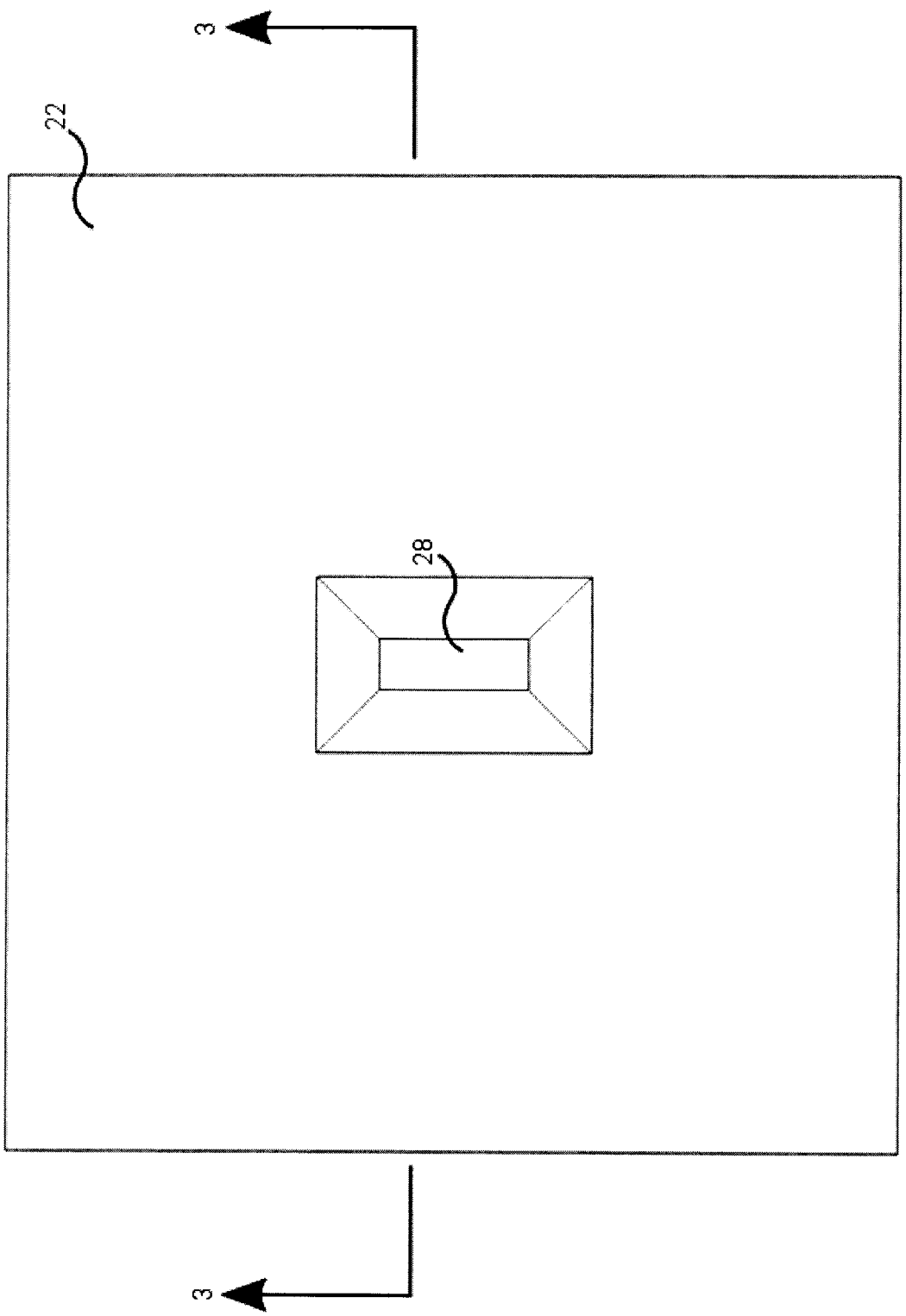
FIG. 2 is a top view of the structure of FIG. 1.
Figure 3:
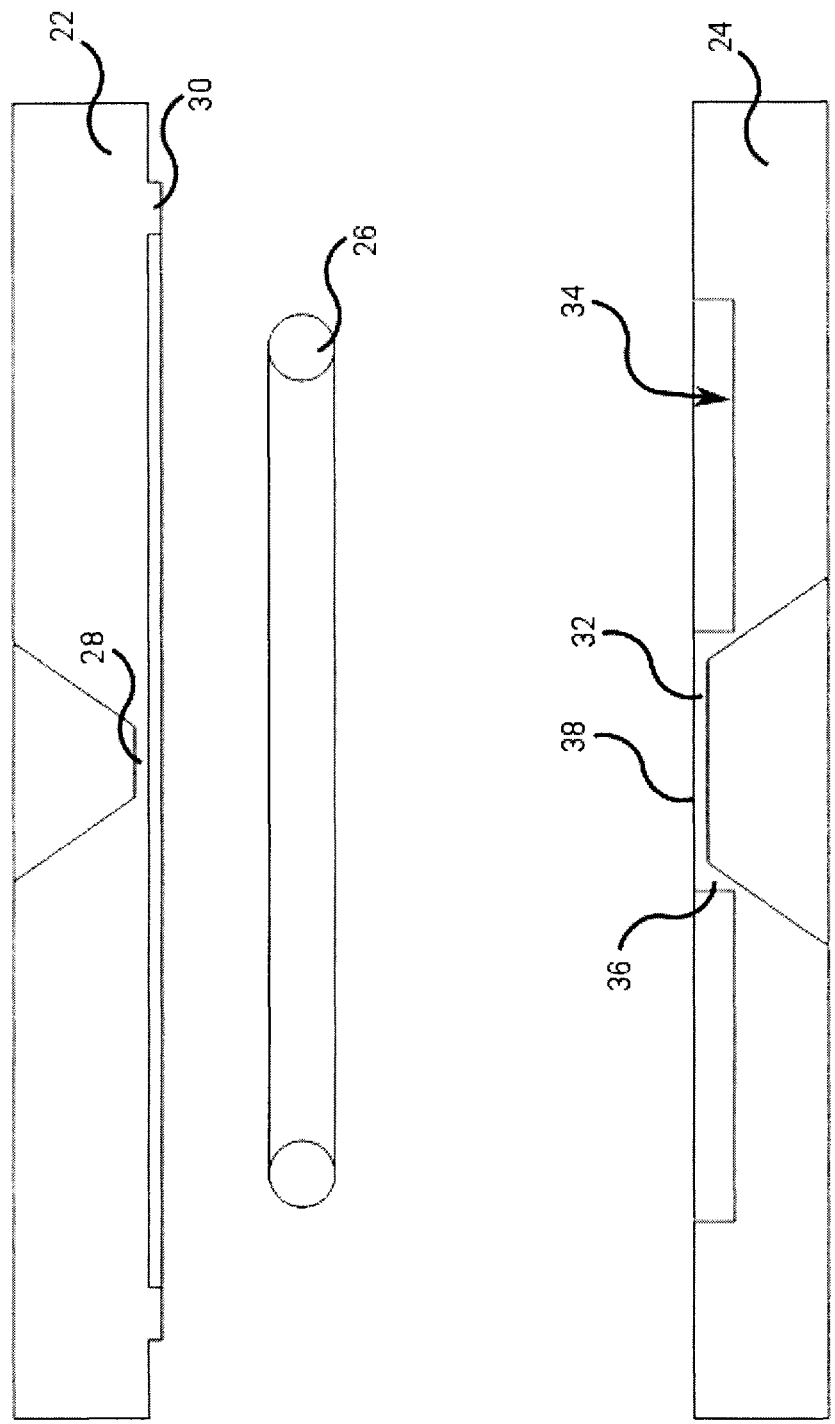
FIG. 3 is a view along 3-3 of FIG. 2.
Figure 4:
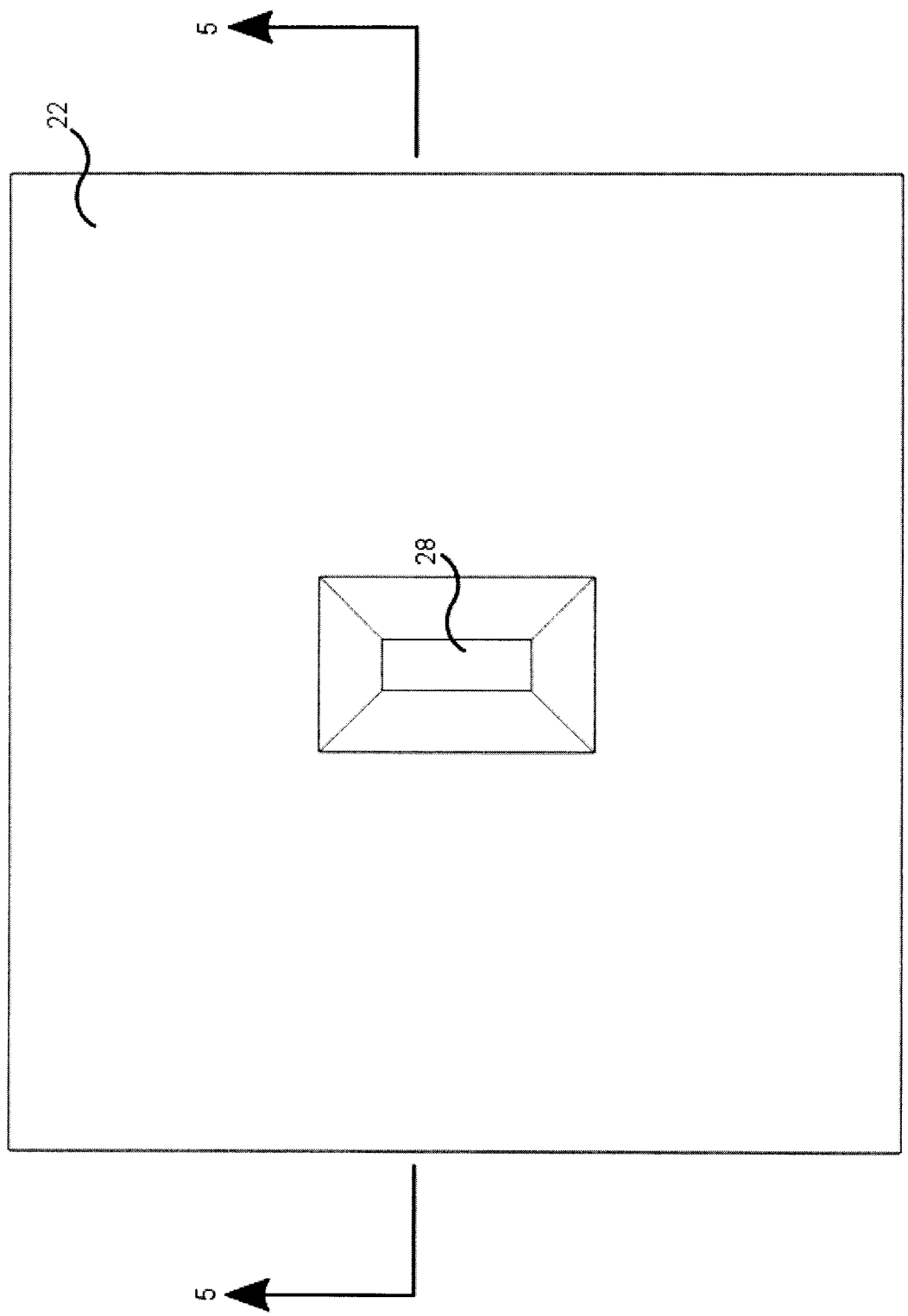
FIG. 4 is a top view of the structure of FIG. 1, with the structure of encircled area 5 of FIG. 1 assembled for use.
Figure 5:
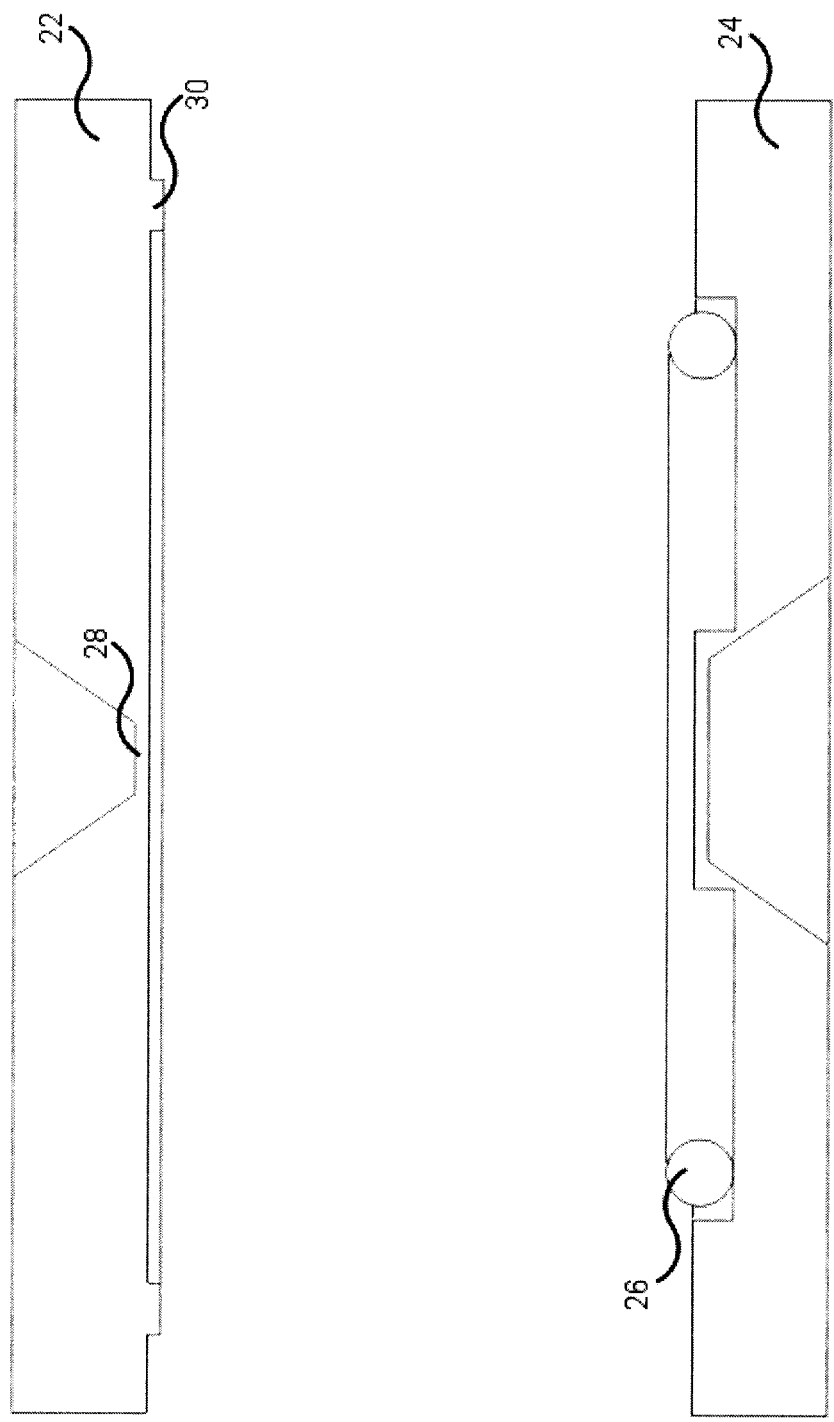
FIG. 5 is a view along 5-5 of FIG. 4.
Figure 6:
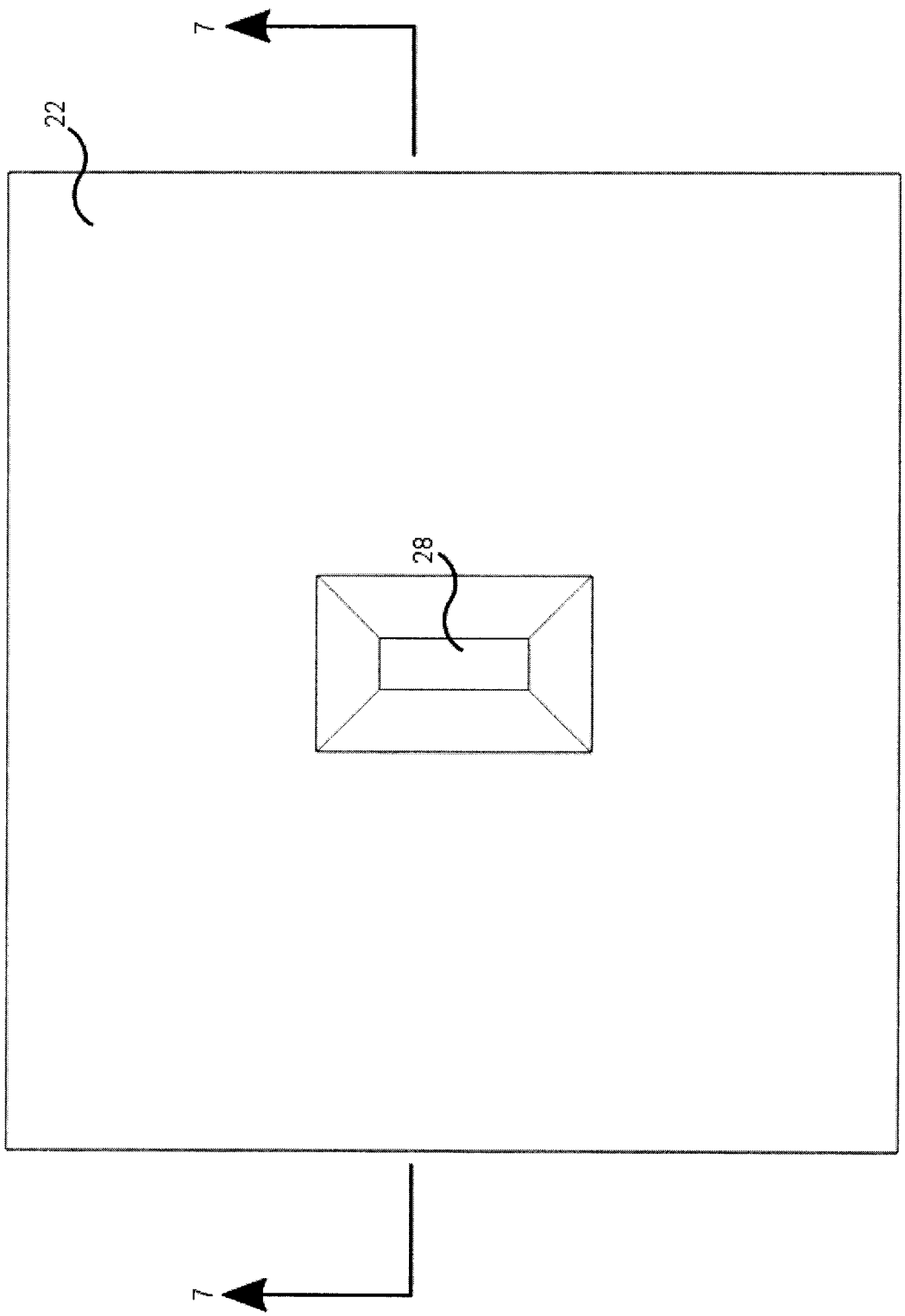
FIG. 6 is a top view of the structure of FIG. 4 in receipt of a droplet.

Description of the Exemplary Embodiment of the Apparatus for Use with an Electron Microscope and for Receiving a Droplet With reference to FIGS. 1-3, this apparatus 20 comprises a pair of silicon bodies 22, 24 and a seal 26. One of the bodies 22 defines a slit-shaped stoichiometric silicon nitride window 28 and a spacer 30. The other 24 of the bodies defines a stoichiometric silicon nitride slit-shaped window 32, a recess 34 and a boss 36 extending from the recess and terminating in a surface 38 in which the window 32 is defined. The seal 26 is an O-ring that is sized and dimensioned, when positioned in the recess as shown in FIG. 5, to project beyond the other of the bodies 24.

Figure 7:
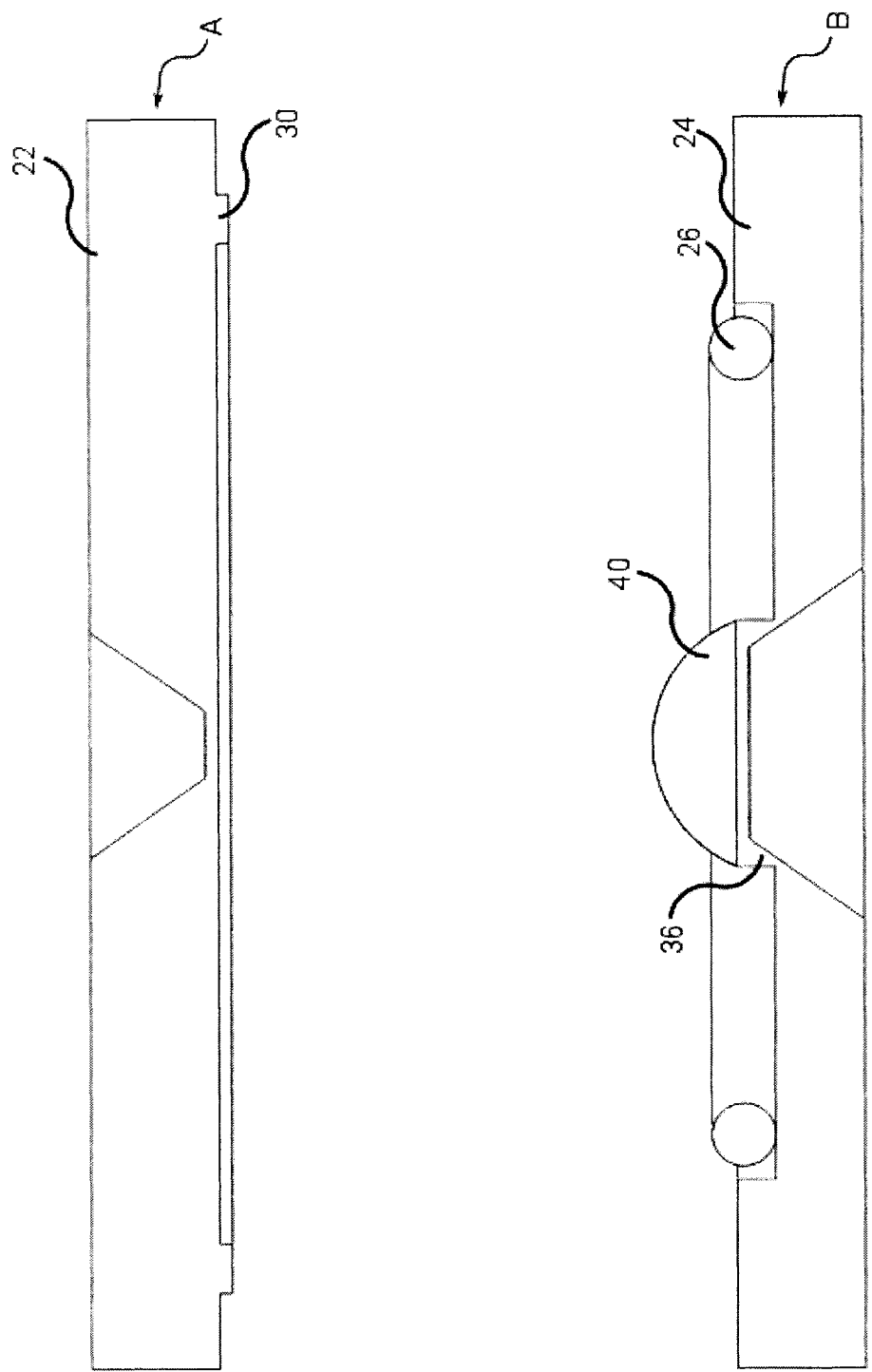
FIG. 7 is a view along 7-7 of FIG. 6.
Figure 9:
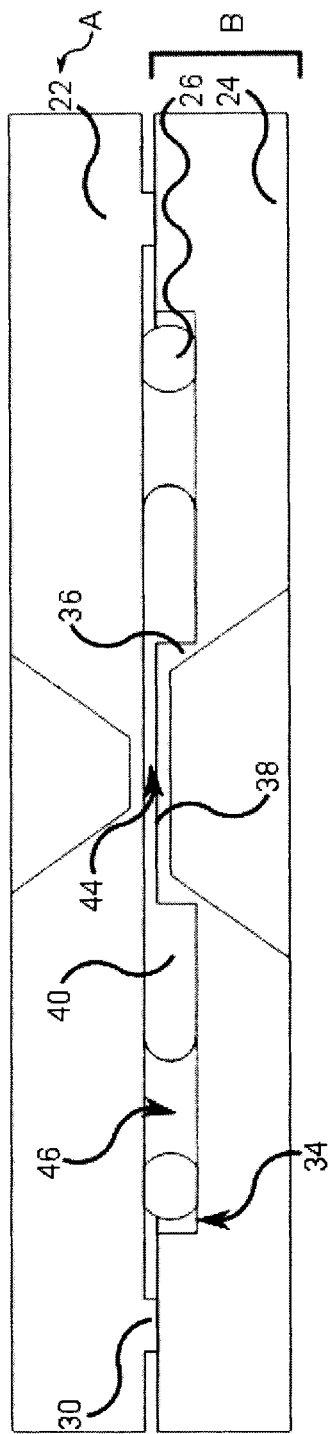
FIG. 9 is a view along 9-9 of FIG. 8.

In use, a droplet 40 of liquid is placed upon the boss, as shown in FIG. 7, and thereafter, the one of the bodies is placed upon the other of the bodies, as shown in FIG. 9, wherein it will be seen that the bodies and seal define a pair of parts A, B, which define a cell for use with said microscope.

The cell has, disposed on opposite surfaces thereof, the pair of slit-shaped windows, the windows being arranged in perpendicular and spaced relation to one another to define a viewable interior volume 44 of the cell at the region of overlap. The cell further has a cavity 46, defined by the seal and the bodies, communicating with the viewable interior volume of the cell, the volume of the cavity, in combination with the viewable interior volume, being larger than the volume of the droplet.

Persons of ordinary skill will readily appreciate that this structure has significant advantage in that it allows for, inter alia, the production of nano-fluidic cells having a reliable liquid viewing depth [the distance between the windows] notwithstanding that a delivery device having a relatively low precision may be used for deposition of the fluid.

Figure 10:
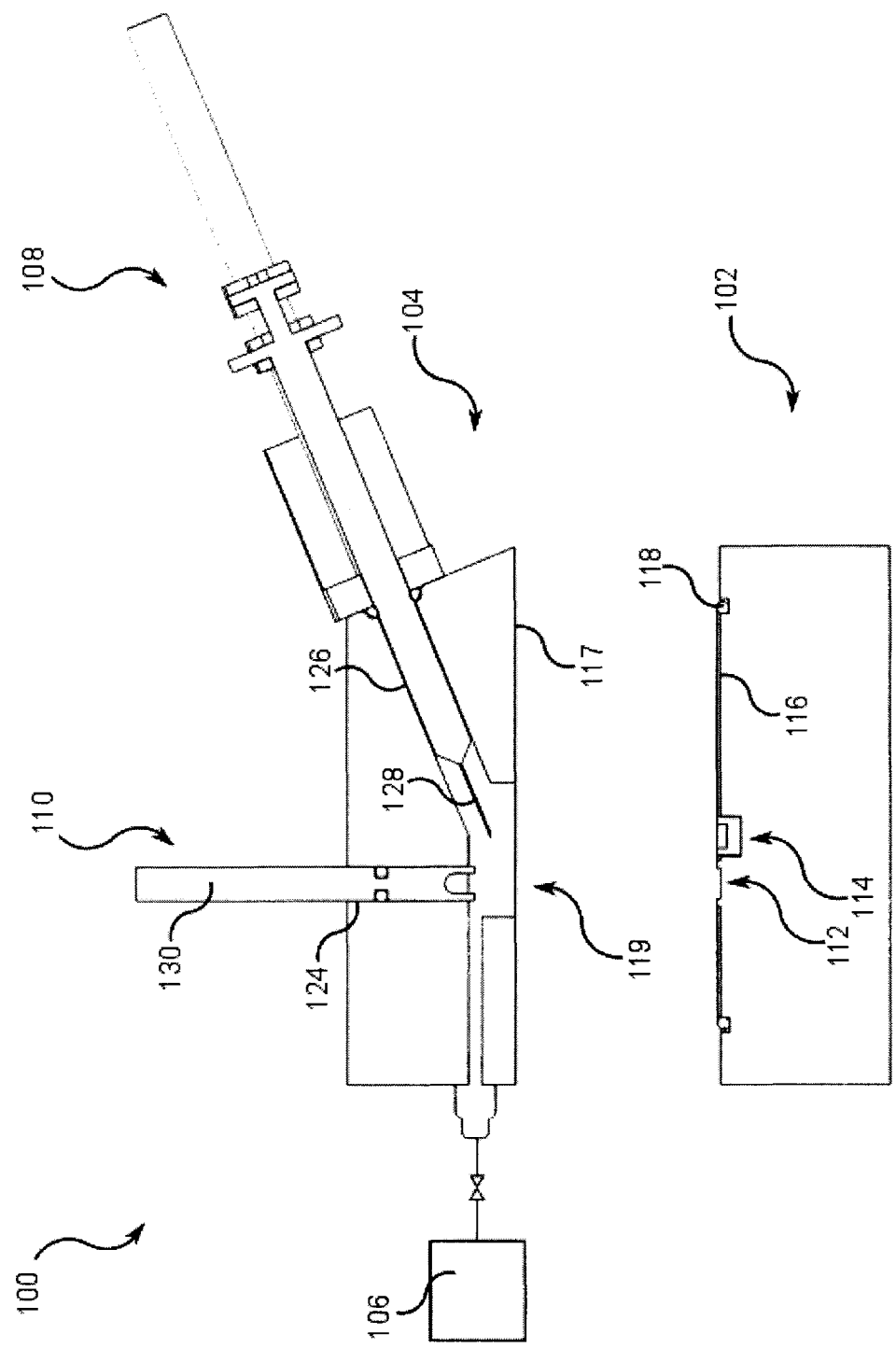
FIG. 10 is a schematic view of an exemplary embodiment of the inventive apparatus for use with a pair of parts, a supply of liquid and an evacuation apparatus, a base and a cover thereof being shown in an open configuration and a needle and a carrier thereof each being in the retracted position.

DESCRIPTION OF THE EXEMPLARY EMBODIMENT OF THE APPARATUS FOR USE with a Pair of Parts, a Supply of Liquid and an Evacuation Apparatus This apparatus 100 is advantageously but not necessarily used with the above-described cell, is used with evacuation apparatus 106 discussed further below, and will be understood to comprise a housing defined by a base 102 and a cover 104, a mechanism 108 and an arrangement 110, all as shown in FIG. 10.

Figure 11:
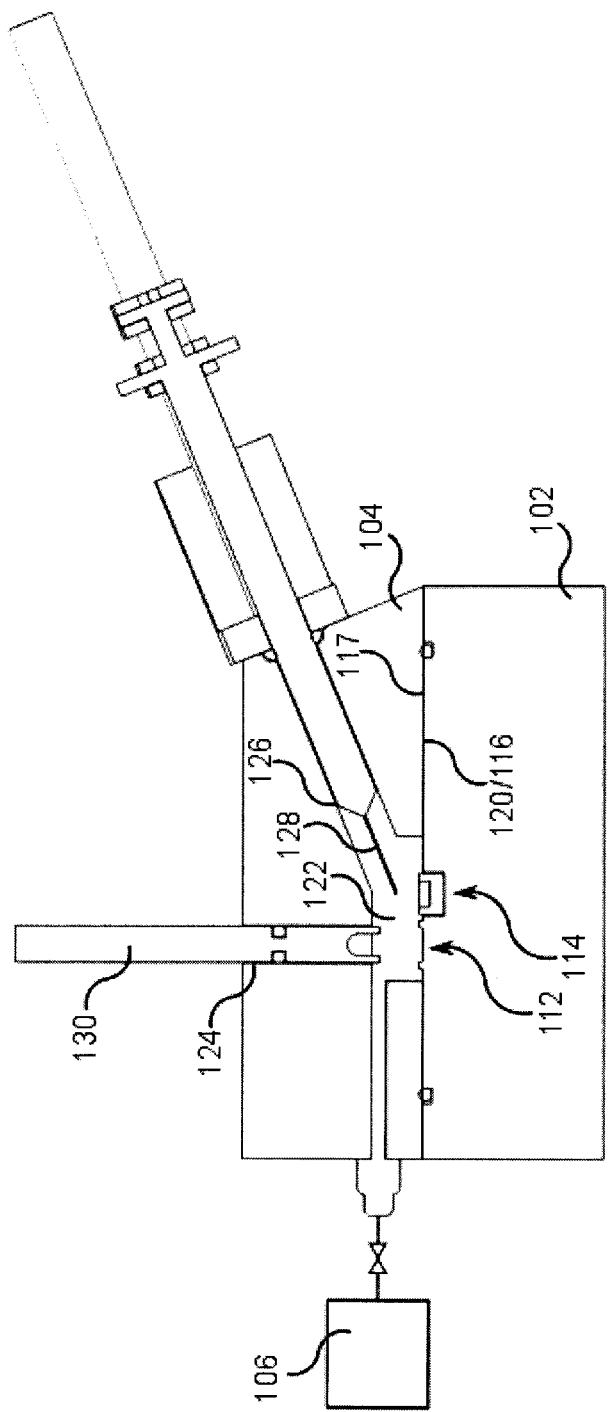
FIG. 11 is a view of the structure of FIG. 10, with the base and cover in the closed configuration.

This base 102 is transparent acrylic and has a receiver 112, a reservoir 114 and a terminal surface 116 in which an O-ring 118 is mounted. This cover 104 is transparent acrylic and has, with the base, an open configuration, as shown in FIG. 10, and a closed configuration as shown in FIG. 11. Cover 104 has a terminal surface 117 in which a hollow 119 is defined.

In the closed configuration: the cover 104 is disposed in abutting, sealed relation to the base 102 along a parting line 120 defined by the junction of the terminal surface 117 of the cover and the terminal surface 116 of the base; the hollow 119 in combination with the base 102, defines a chamber 122 which encompasses the receiver 112 and the reservoir 114.

In the open configuration, the cover 104 is disposed above and in spaced relation to the base 102. The cover 104 also defines a throughpassing vertical channel 124 that extends to the chamber 122 and a throughpassing passage 126 that extends to the chamber 122 and at an angle to the vertical channel 124.

Figure 12:
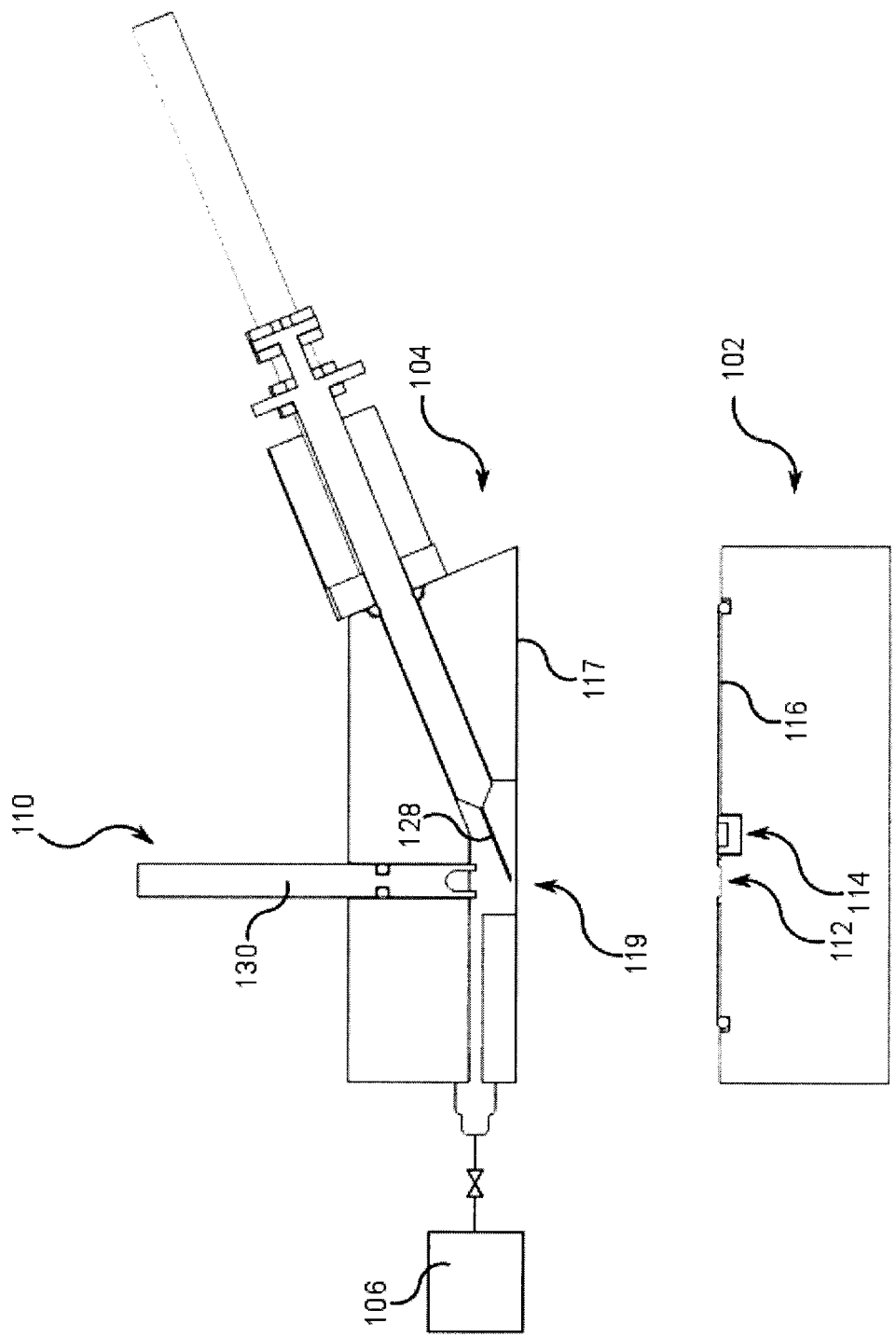
FIG. 12 is a view of the structure of FIG. 10 with the needle in the extended position.

The mechanism 108 comprises a needle 128 mounted, in a hermetically sealed manner, for reciprocating movement in the throughpassage between a retracted position, as shown in FIG. 10, whereat the needle does not lie in the path of the vertical channel, and an extended position, as shown in FIG. 12, whereat the needle lies in the path of the vertical channel. Needle 128 is mounted for said movement via a microcontroller in the form of a fine-threaded screw (not shown).

Figure 13:
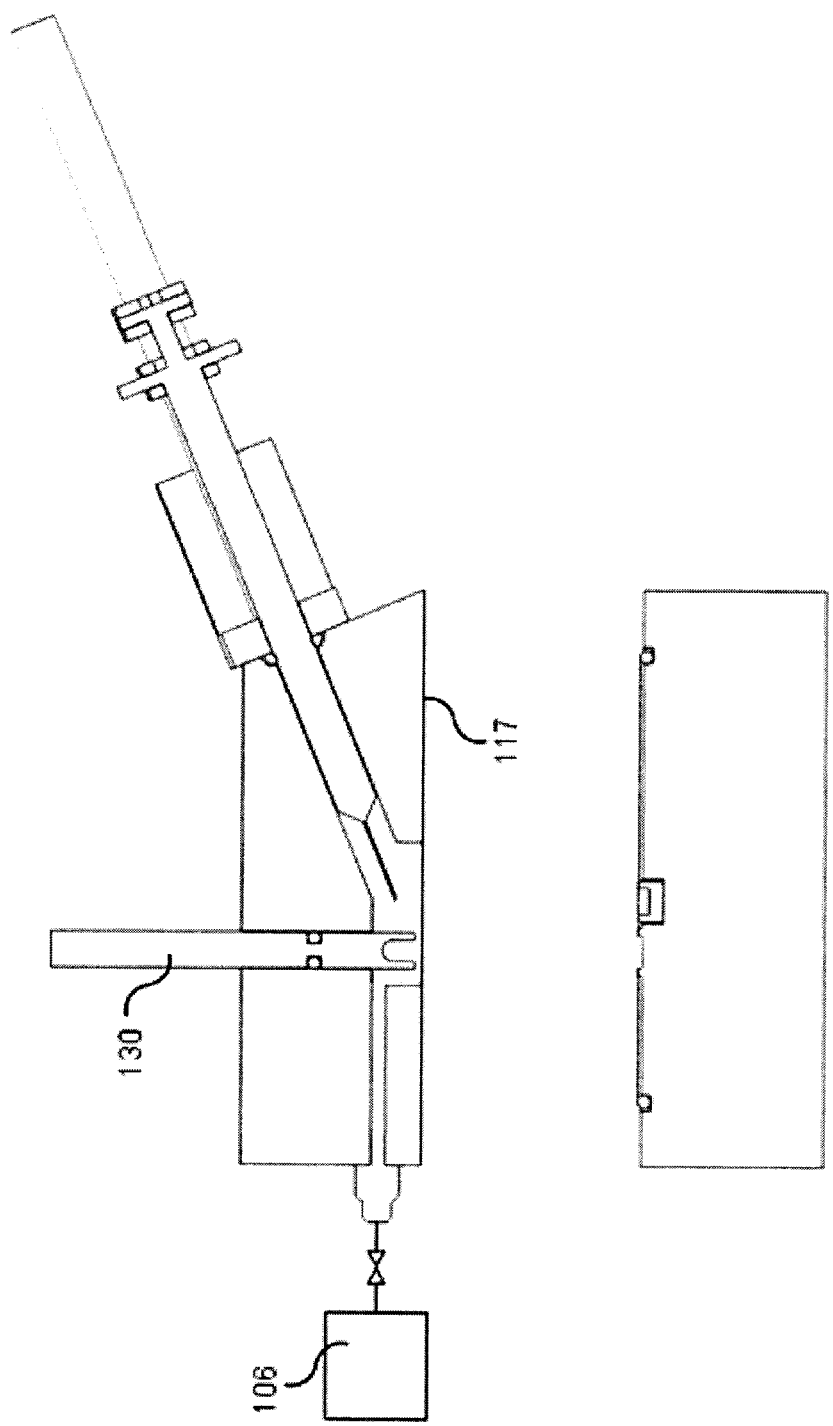
FIG. 13 is a view of the structure of FIG. 10 with the carrier in the extended position.

The arrangement 110 comprises an arm 130 mounted, in a hermetically sealed manner, for reciprocating movement in the vertical channel between a retracted position, as shown in FIG. 10, whereat it terminates relatively distal to the parting line, and an extended position, as shown in FIG. 13, whereat it terminates relatively proximal to the terminal surface 117 of the cover.

The evacuation apparatus 106 shown and with which the apparatus can be used is a selectively actuable vacuum pump adapted to communicate with the chamber 122.

Figure 14:
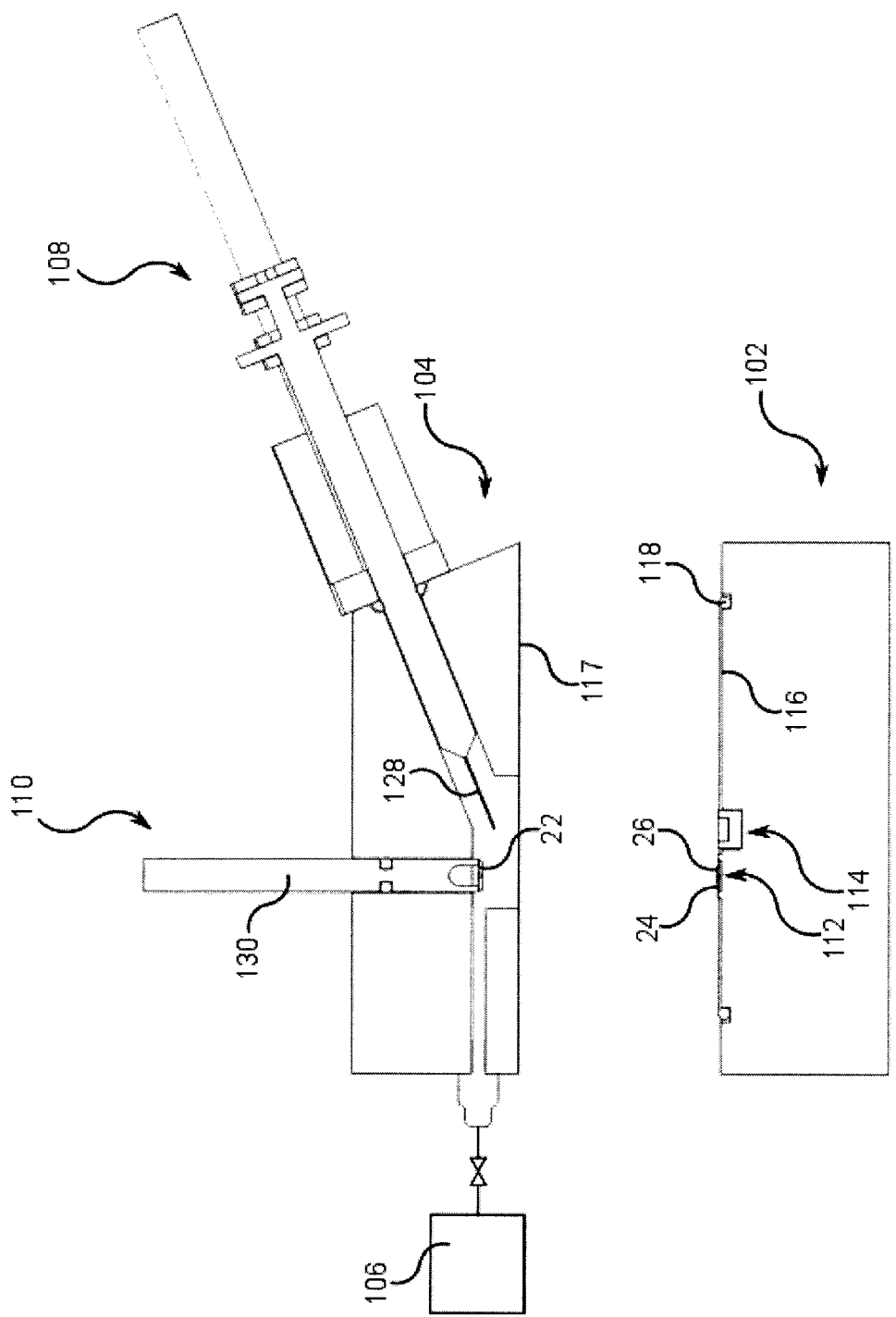
FIG. 14 is a view of the structure of FIG. 10 in use with the structure of FIG. 1.

In use, the base and cover are disposed in the open configuration, and the syringe is moved to the retracted position, to permit, all as shown in FIG. 14, the other 24 of the bodies to be placed in the receiver 112, with seal 26 in place or subsequently placed in position, liquid to be placed in the reservoir 114 and the one 22 of the bodies to be secured to the arm 130 by low-tack adhesive (e.g. polydimethylsiloxane (PDMS) silicone rubber).

Figure 15:
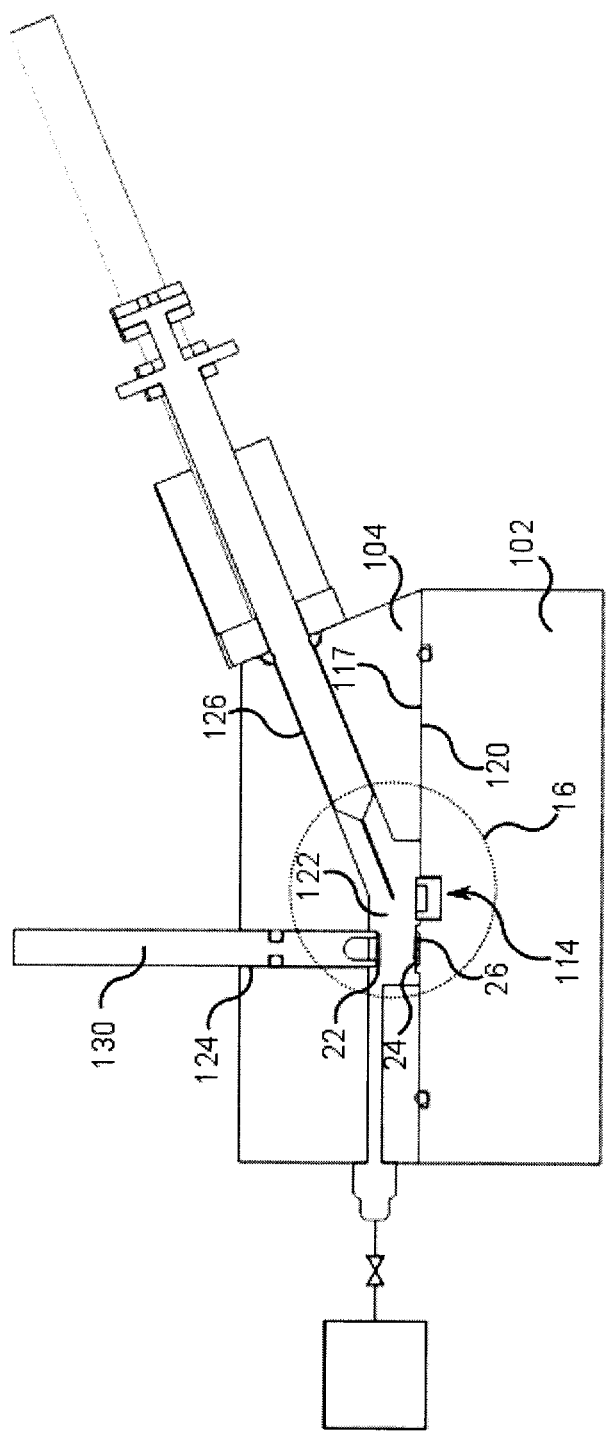
FIG. 15 is a view of the structure of FIG. 14 with the base and cover in the closed configuration.
Figure 16:
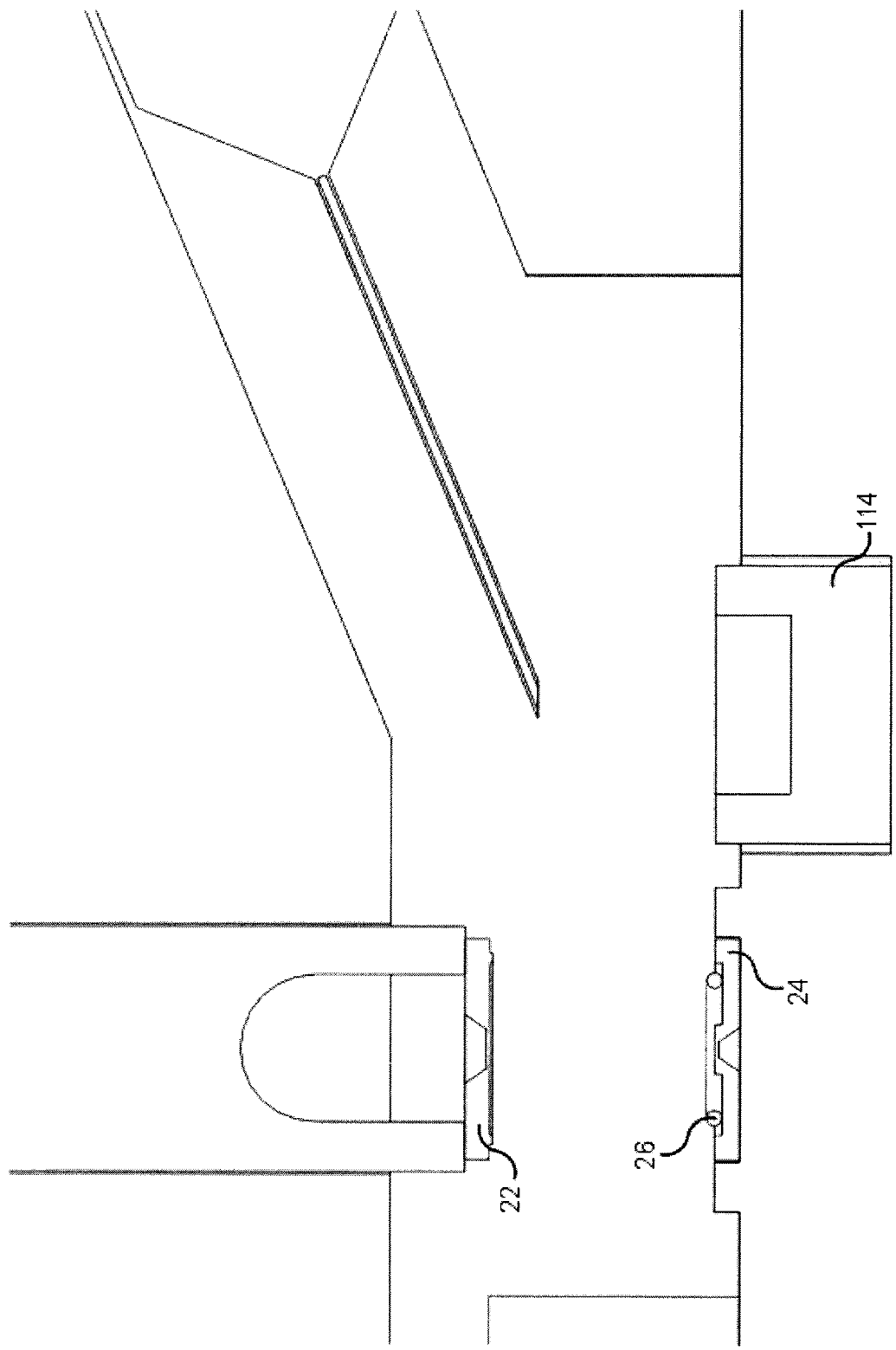
FIG. 16 is an enlarged view of encircled area 16 of FIG. 15.
Figure 17:
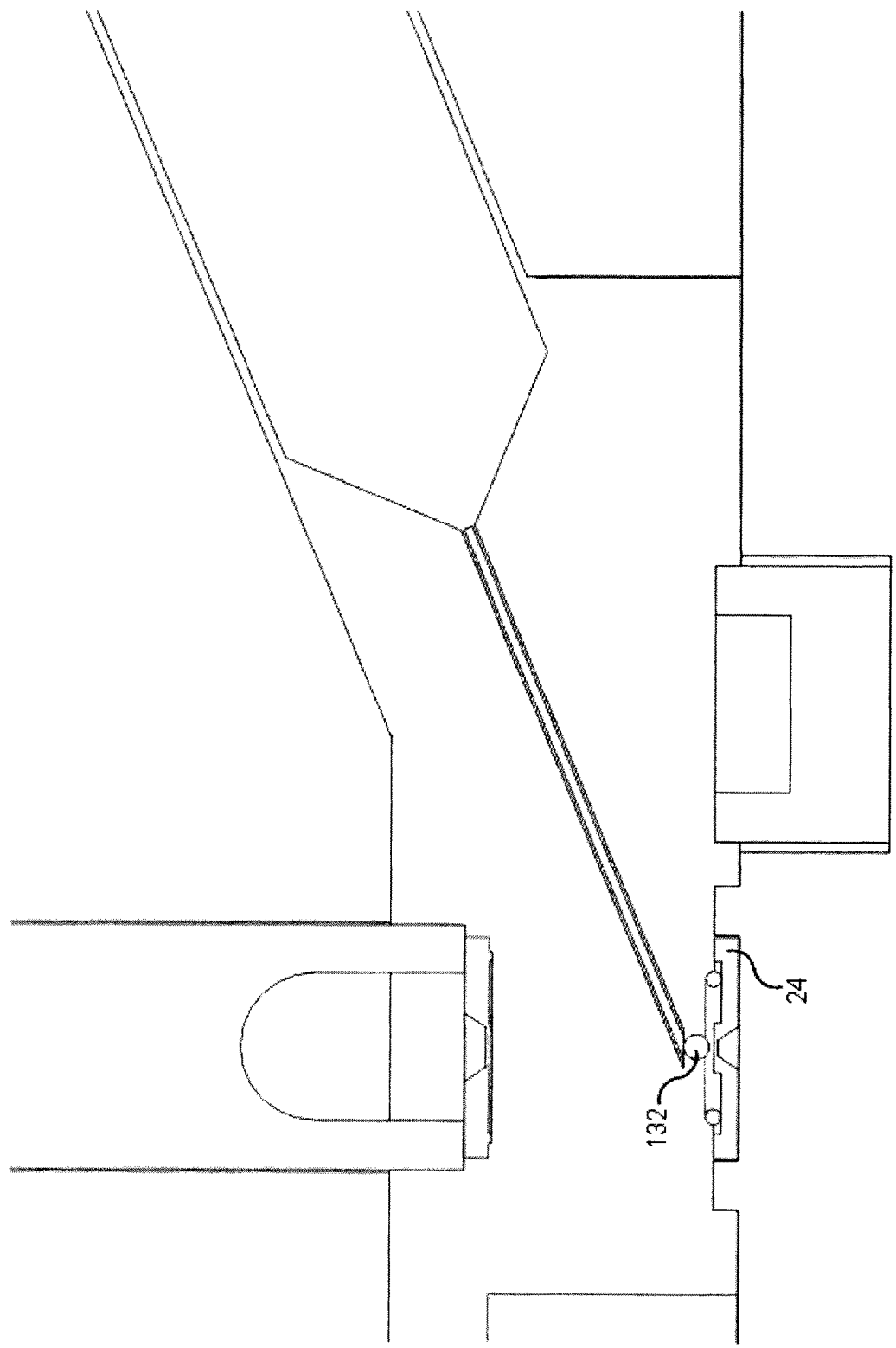
FIG. 17 is a view of the structure of FIG. 16 with the needle in the extended position and a sample being deposited on the other of the bodies.
Figure 18:
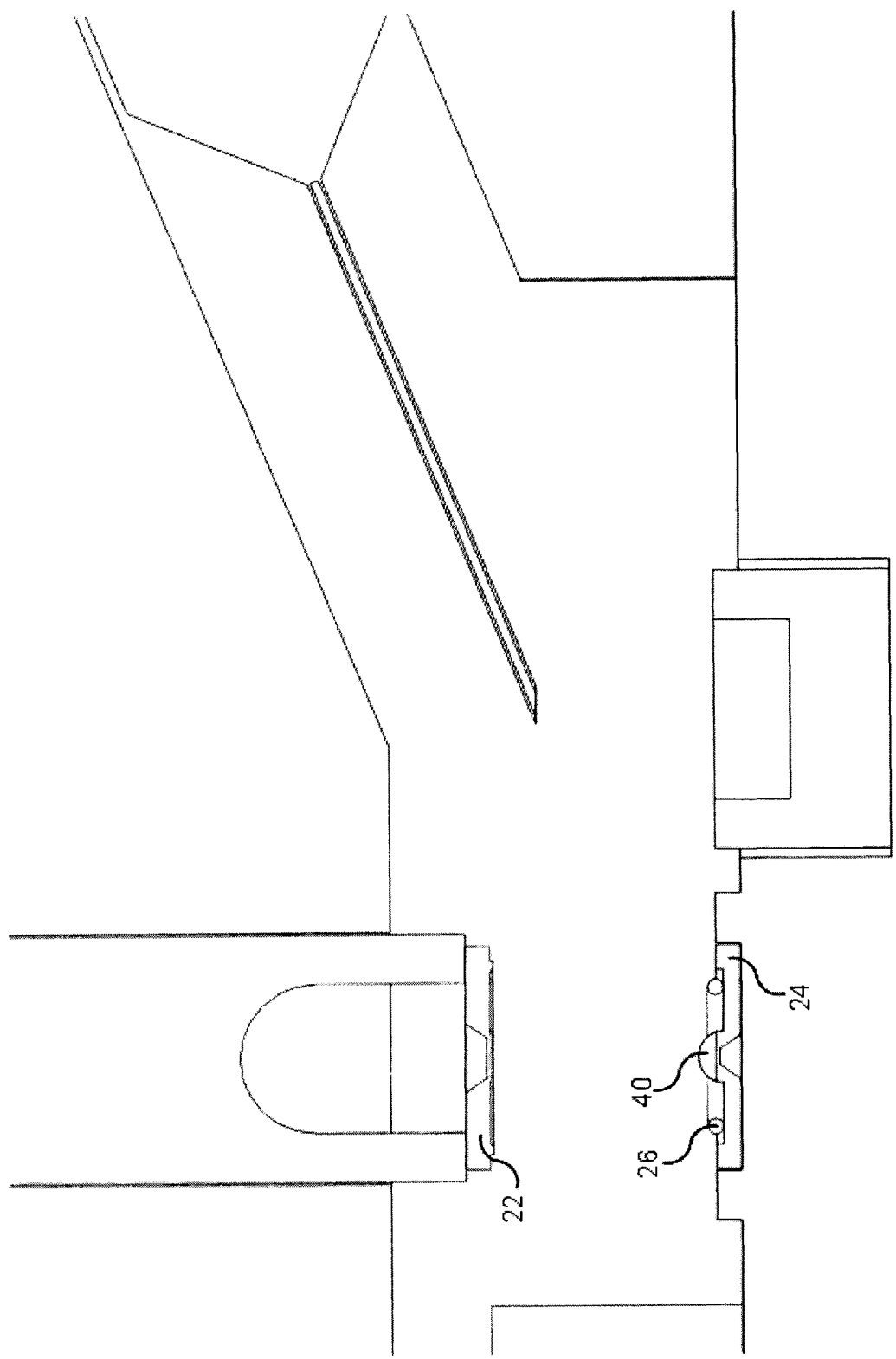
FIG. 18 is a view of the structure of FIG. 17 with the needle in the retracted position and the droplet on the other of the bodies.
Figure 19:
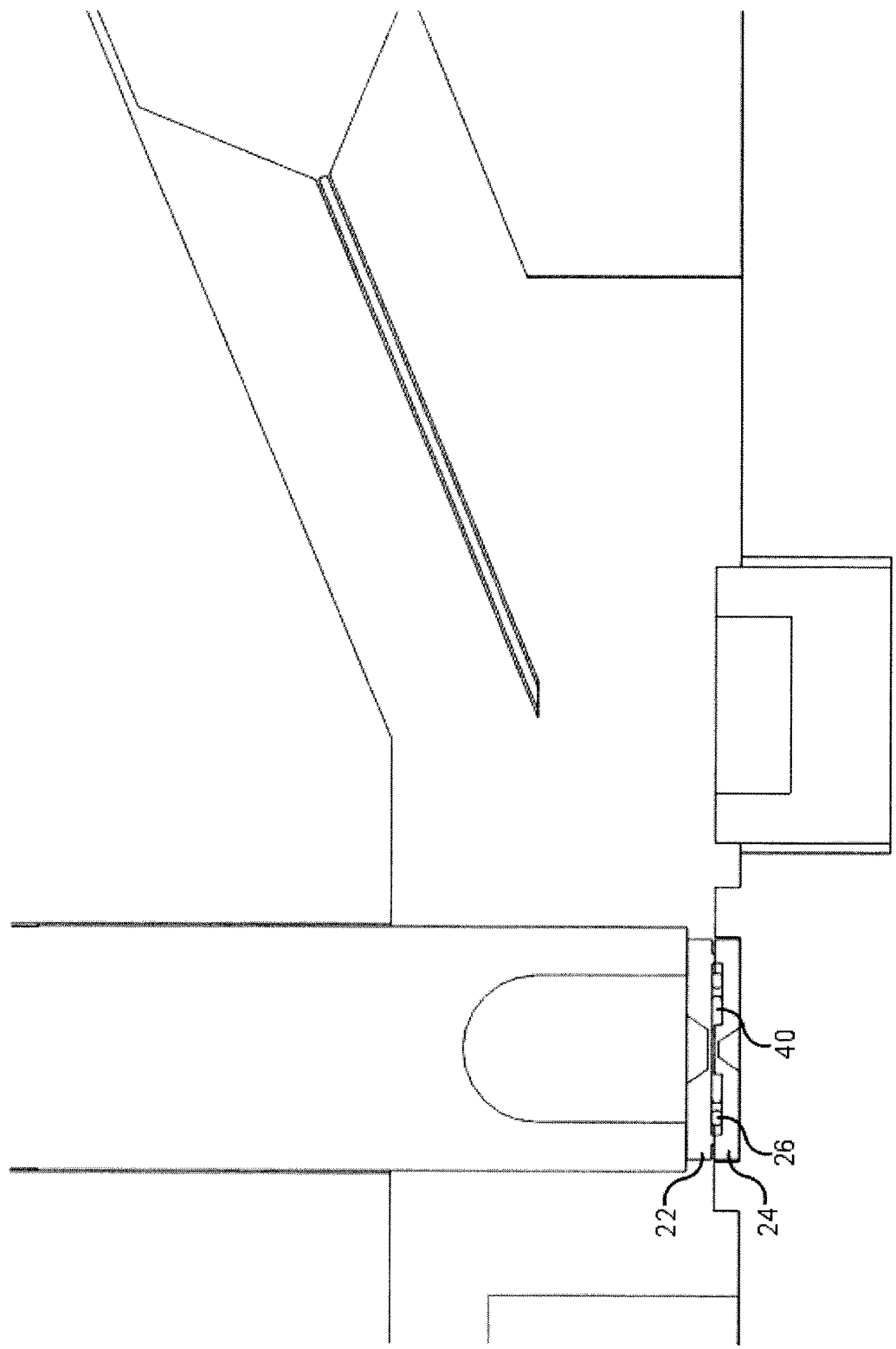
FIG. 19 is a view of the structure of FIG. 18 with the arm in the extended position.

Thereafter:
- if not already done, the arm is moved to the retracted position and the base and cover are moved to the closed configuration, to define the chamber which now overlies the reservoir and the other of the parts, all as shown in FIG. 15;
- the evacuation apparatus is used to produce vacuum conditions in the chamber;
- the syringe is moved to extended position, to deposit a droplet 132 on the other of the parts, as shown in FIG. 17;
- the sample is optionally concentrated [by virtue of the evacuating conditions] to a desired amount as determined by imaging [available as a result of the transparent construction];
- the deposition and/or concentration steps are optionally repeated until such time as a sample of a desired volume and concentration is suitably positioned, as shown in FIG. 18;
- with the syringe in the retracted position, the arm is extended to deposit the one of the parts on the other of the parts, as shown in FIG. 19;
- the chamber is vented to atmosphere, whereupon the atmospheric pressure holds the bodies together to form a nanofluidic chip; and
- the chip is removed from the low-tack adhesive, for subsequent use.

Advantages

Assembling the nanofluidic cell under vacuum conditions has advantage in that, when the NFC is subsequently placed inside the electron microscope, the pressure differential across the cell is relatively low, which minimizes window deformation and provides relatively high liquid thickness (sampling) uniformity and reproducibility.

Variations

Whereas a single embodiment of each of the cell and loading station is described, persons of ordinary skill will appreciate that variations are possible.

For example, materials other than silicon can be employed for the bodies.

Additionally, the spacer could be placed in the bottom body or avoided altogether and, when provided, does not necessarily need to be etched-in on silicon-wafer surface; it may be formed by adding any suitable material.

As well, the boss need not be round and could take any shape or even be omitted; the surface could, for example, merely be a surface on the other of the cells having a high affinity for the liquid.

Moreover, the window need not be stoichiometric silicon nitride. Other window materials may be used (for example non-stoichiometric silicon nitride, silicon oxide, aluminum oxide, boron nitride, carbon, indium tin oxide, aluminum, titanium, chromium, etc.).

Further, windows with a plurality of materials may be used to optimize nanofluidic cell performance. As well, when larger viewing areas are required, a plurality of windows may be provided.

As well, various techniques can be used to define the cavity, including but not limited to reactive ion etching, wet etching, etc. The recess can also be formed on either or both of the bodies.

It should also be appreciated that the invention is not restricted to the use of a single O-ring as sealant; other kinds of sealants may be used (e.g. gold, indium, titanium, chromium, low melting point alloys, epoxy, glue, gasket, etc.)

The use of a sealant is not necessary. Highly polished and clean surfaces of the bodies could seal in abutting configuration.

Electrical connections may be added to this invention for heating, electrochemistry, etc.

A plurality of nanofluidic cells may be loaded at the same time in the same electron microscope holder for higher throughput.

Figure 20:
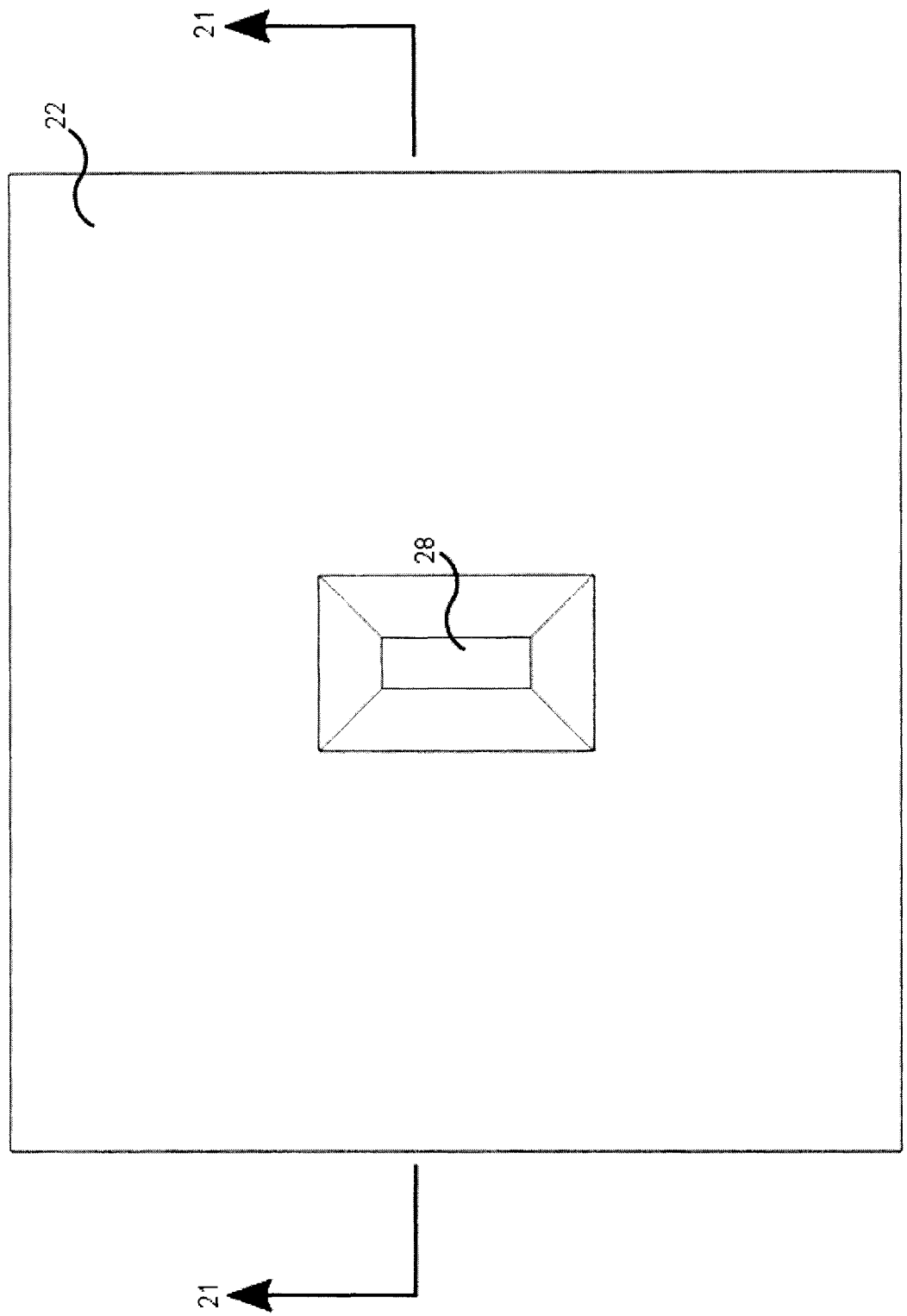
FIG. 20 is a top view, similar to FIG. 8, of an alternate embodiment of the apparatus of FIG. 1.
Figure 21:
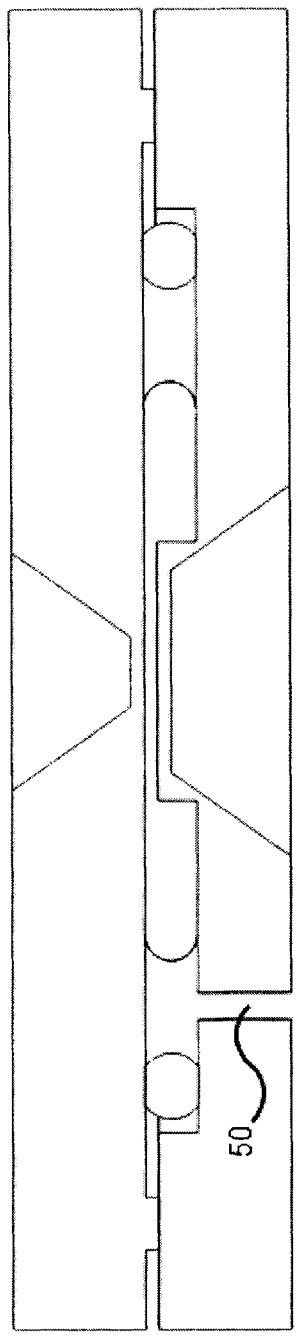
FIG. 21 is a view along 21-21 of FIG. 20.

With the addition of at least one small opening 50 connecting the inner volume of the cell with the outside, the inner cell pressure could be modified after closing the cell (FIGS. 20 and 21).

A plurality of syringes/liquid dispensers may be used, for sample mixing and/or loading of several cells in tandem.

Liquid dispensers (syringes) may access the base from any angle.

Locations, shapes and quantities of micro-controllers may vary and may be electronically and/or manually controlled.

The inner diameter, the wall thickness, and the shape, as well as the material of the liquid dispenser needle may be optimized for a given type of liquid, dispenser and dispenser angle.

Liquid dispenser and/or liquid dispenser needle may be reusable after proper cleaning.

Cameras and motorized computer-controlled stages can be implemented for automation.

Any kind of imaging can be used to monitor droplet size; shadow imaging is not essential.

Gripping can be effected by means other than low-tack adhesive (e.g. oil, vacuum grease, etc.). Vacuum could potentially be used, if a suitable differential can be obtained.

Terminal surfaces 116 and 117 do not necessarily have to be in contact to close and define chamber 122; sealant 118 closes chamber 122 between surfaces 116 and 117.

Figure 22:
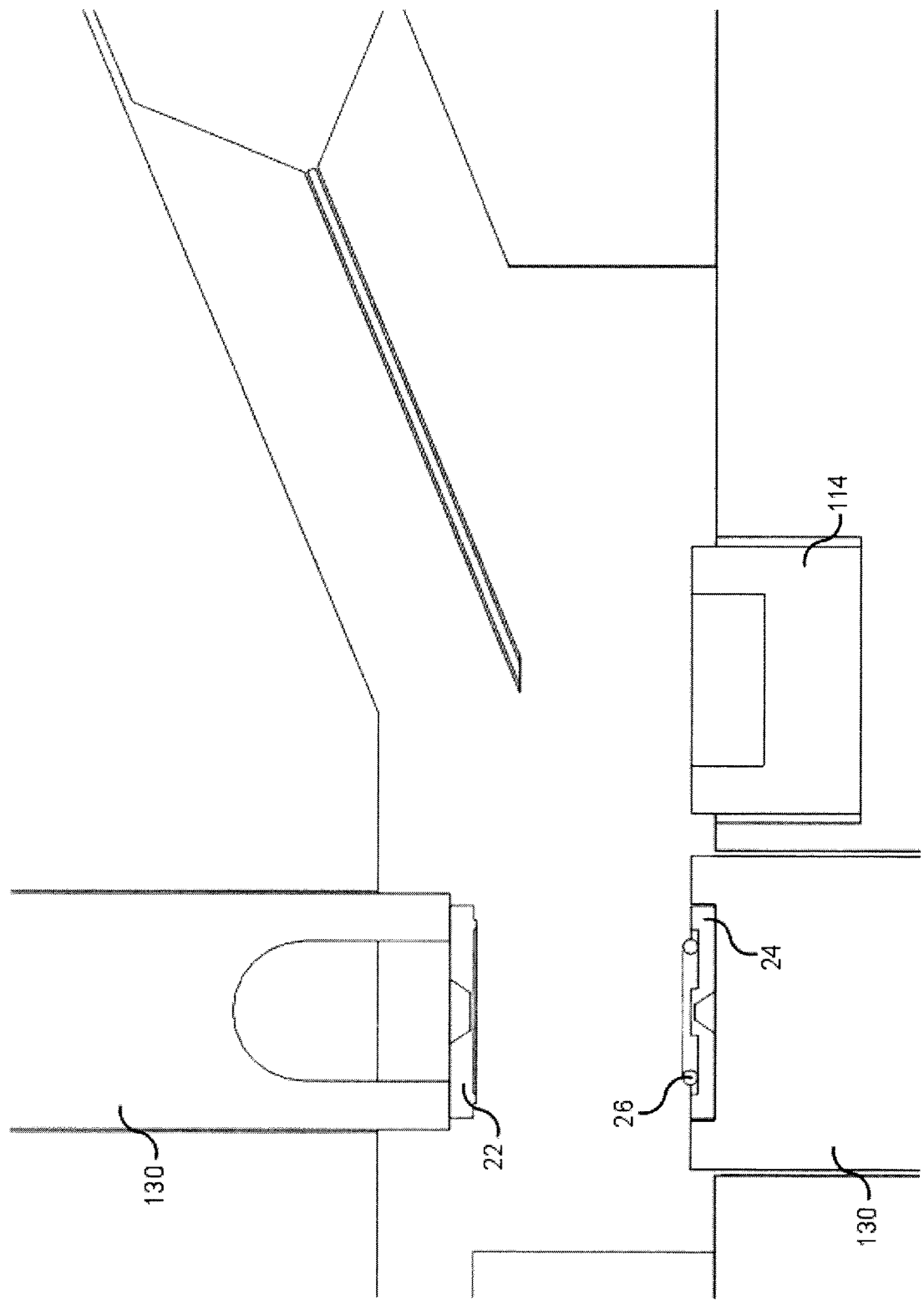
FIG. 22 is a view, similar to FIG. 16, of an alternate embodiment of the apparatus of FIG. 10.

A plurality of arms, like arm 130 or similar, may be added to the bodies for better performance (FIG. 22).

Figure 23:
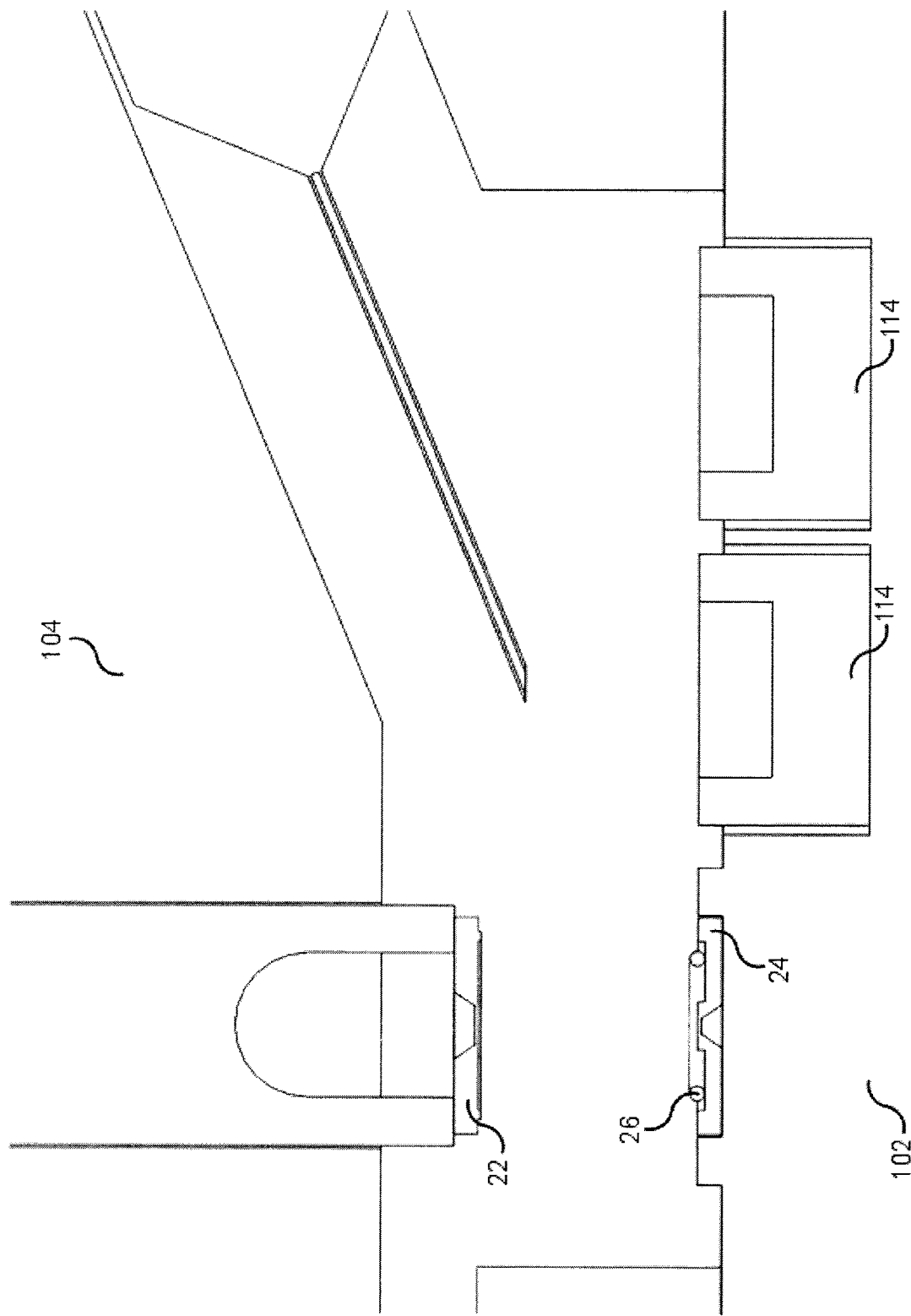
FIG. 23 is a view, similar to FIG. 16, of an alternate embodiment of the apparatus of FIG. 10.
Figure 24:
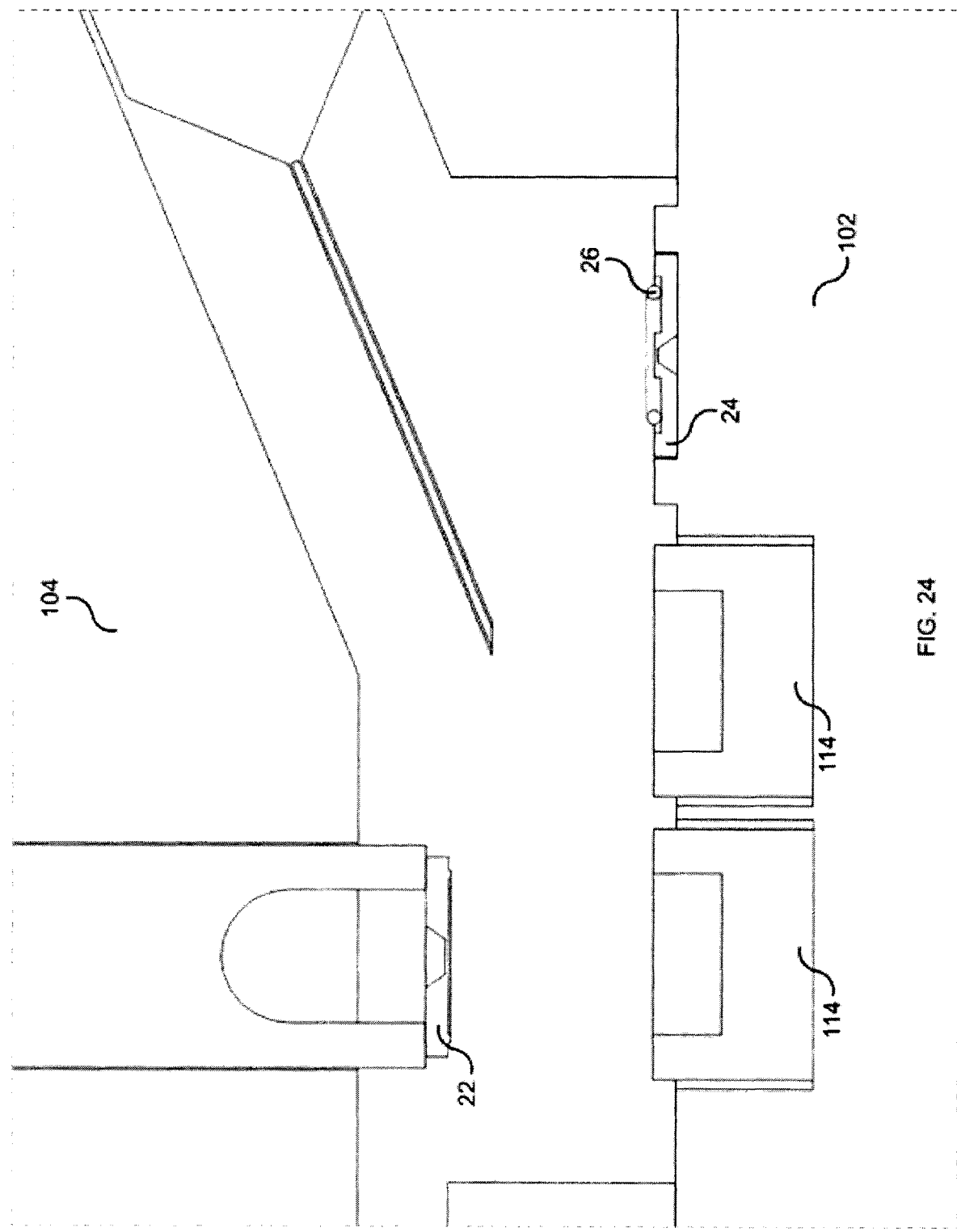
FIG. 24 is a view, similar to FIG. 23, of an alternate rotation of the embodiment of the apparatus of FIG. 23.

A plurality of reservoirs 114 may be added inside the chamber to load the in-liquid sample in the needle with the chamber open or closed; and bodies 102 and 104 may rotate respect to each other (FIGS. 23 and 24).

Figure 25:
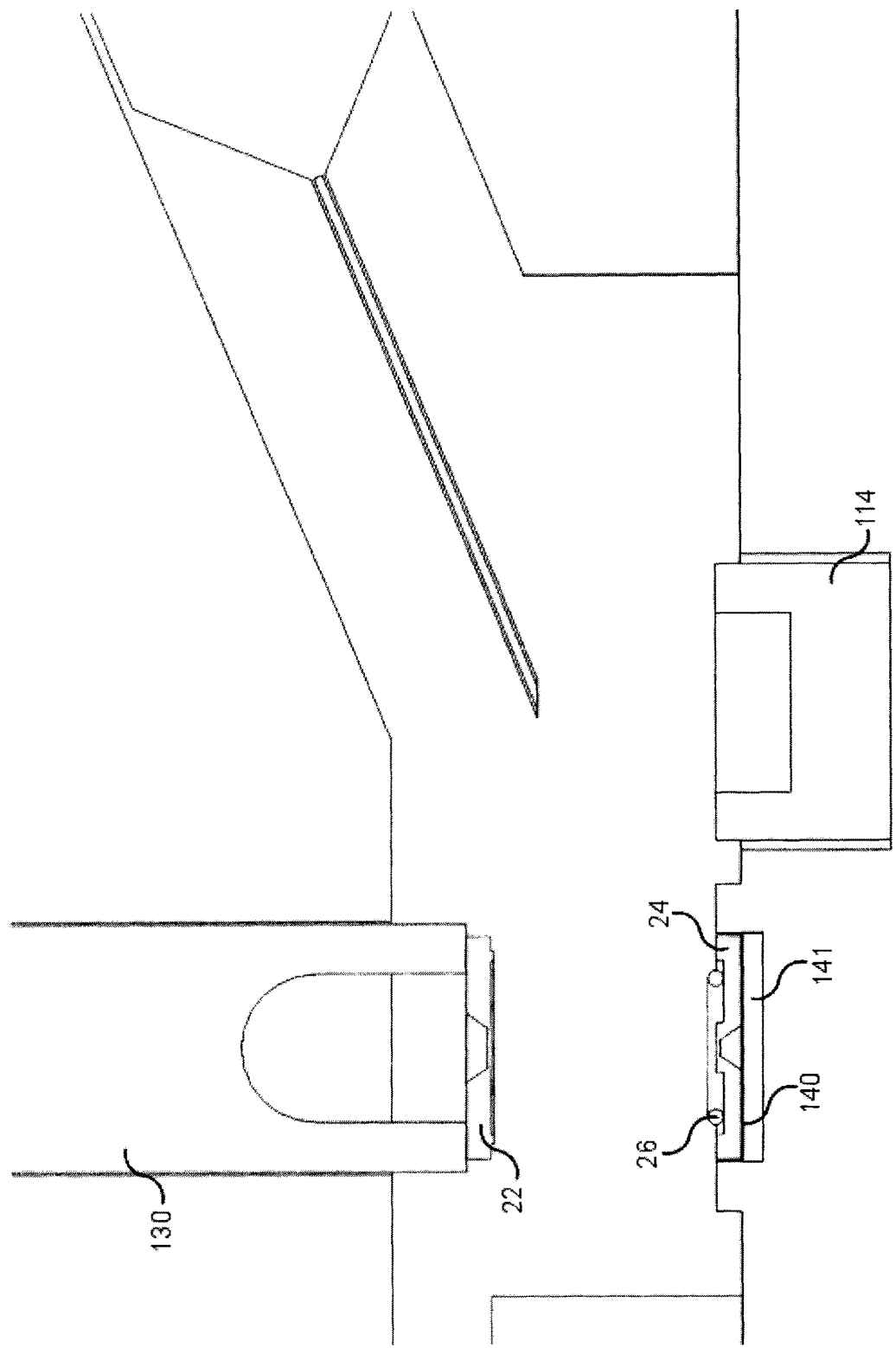
FIG. 25 is a view, similar to FIG. 16, of an alternate embodiment of the apparatus of FIG. 10.

Parts may be in contact with a surface 140 with controlled temperature stage 141 (FIG. 25).

Figure 26:
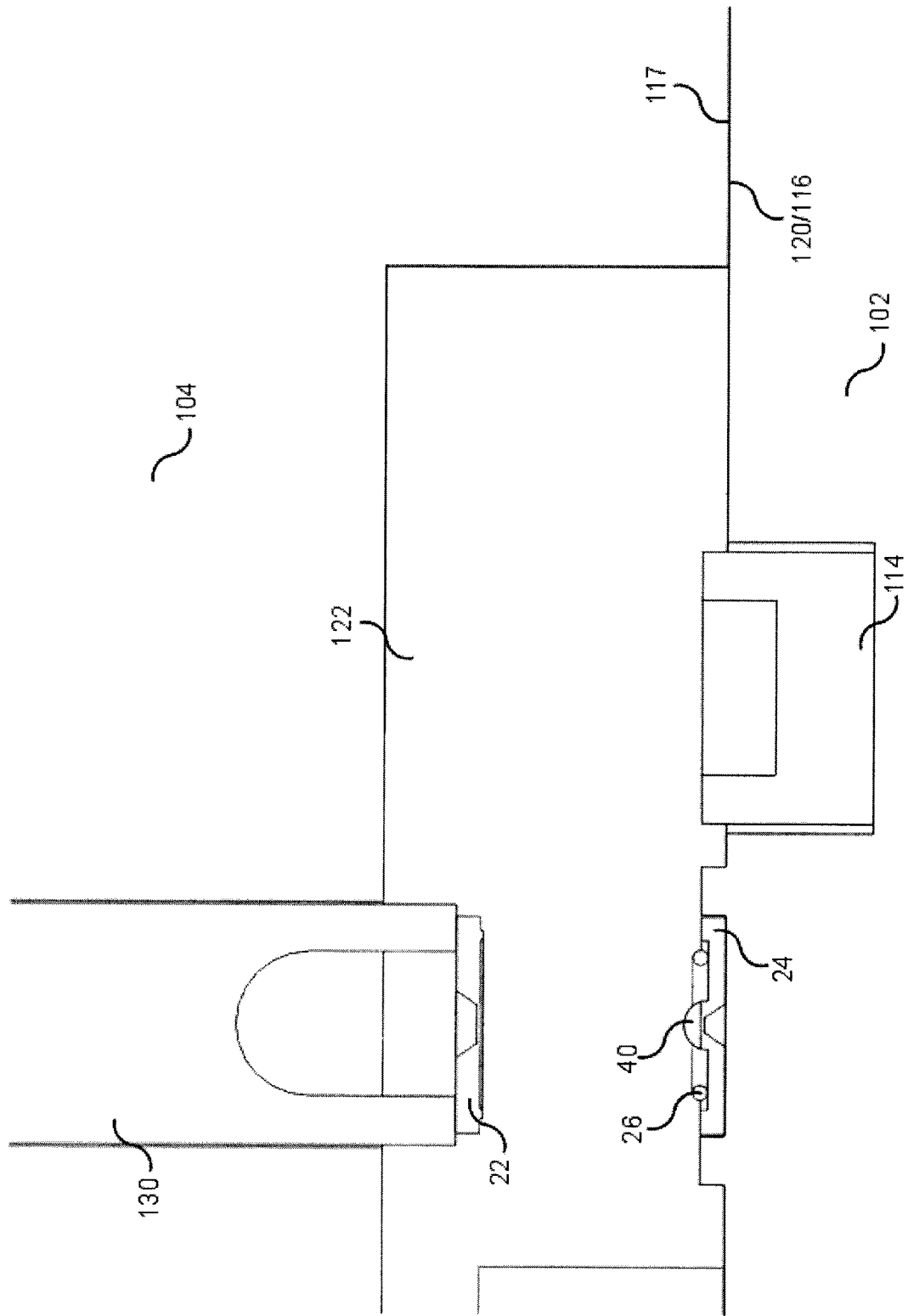
FIG. 26 is a view, similar to FIG. 16, of an alternate embodiment of the apparatus of FIG. 10.

Droplet 40 may be loaded on part 24 with chamber 122 open, such that throughpassing passage 126 and reciprocating syringe 108 may be omitted, as shown in FIG. 26.

Figure 27:
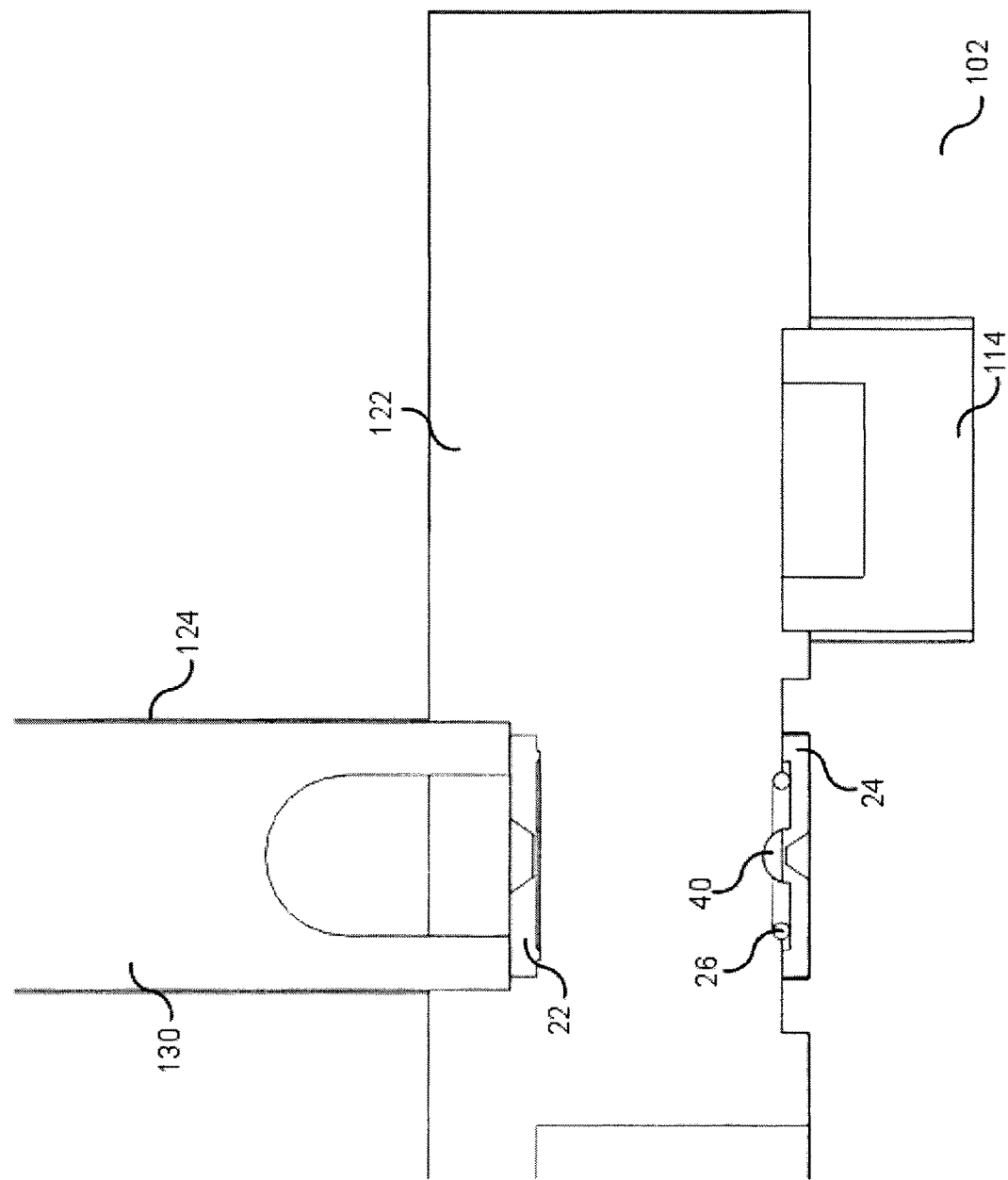
FIG. 27 is a view, similar to FIG. 16, of an alternate embodiment of the apparatus of FIG. 10.
Figure 28:
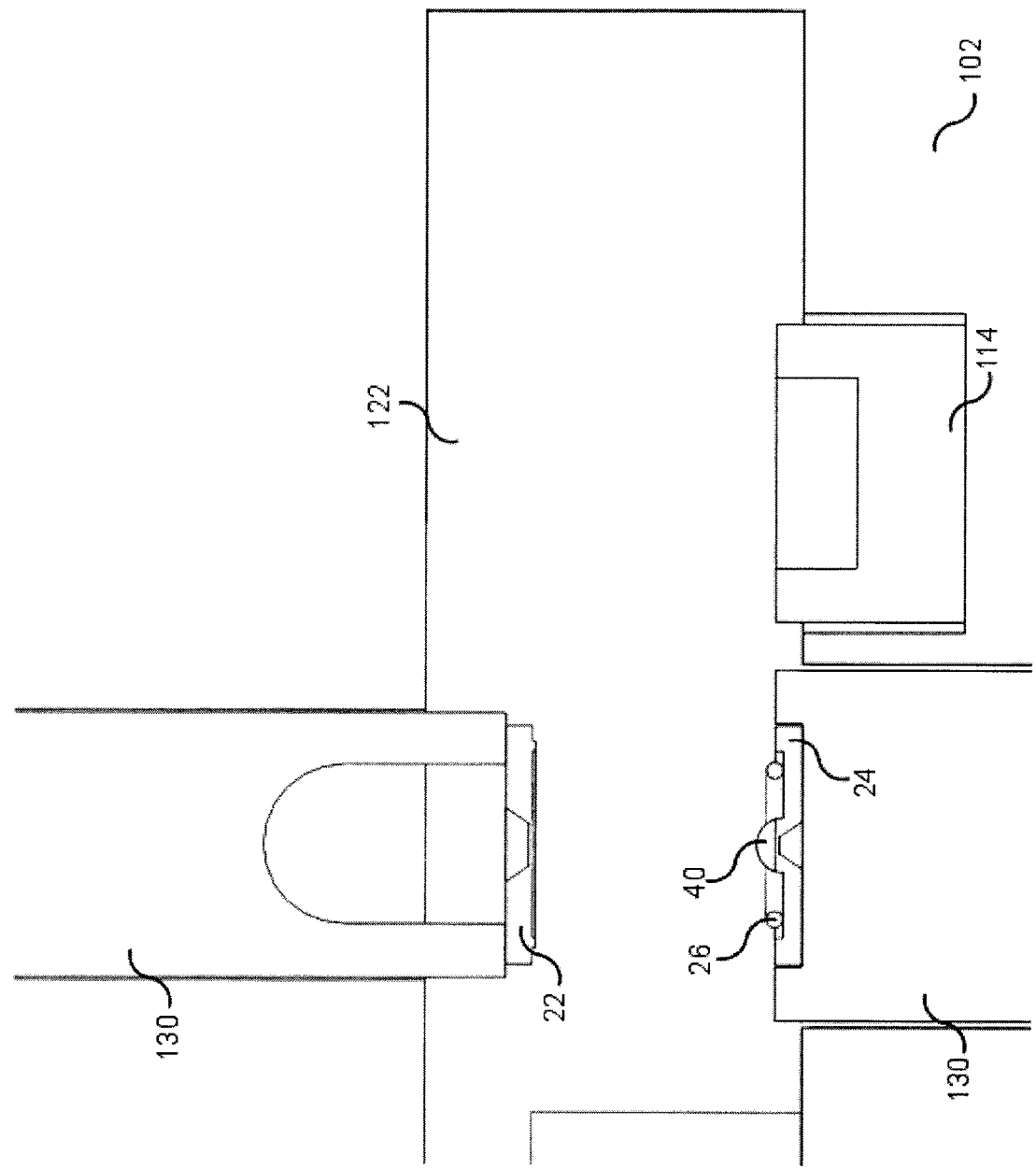
FIG. 28 is a view, similar to FIG. 16, of an alternate embodiment of the apparatus of FIG. 10.

The separable base and cover system may be avoided. For example, arm 130 could be removable, to allow part 24 to be placed in receiver and droplet to be placed upon part 24 through passage 124, as suggested by FIG. 27. Both parts 22 and 24 could also be placed on carriers 130, as shown in FIG. 28.

Bottom of chamber 122 may be used as reservoir 114.

Part 22 does not necessarily need to be placed on a movable arm. It could be placed, for example, on a removable lid, or onto the upper surface of the chamber through a port, neither shown; in either situation, part 24 would be placed upon a movable arm, as shown in FIG. 28.

Figure 29:
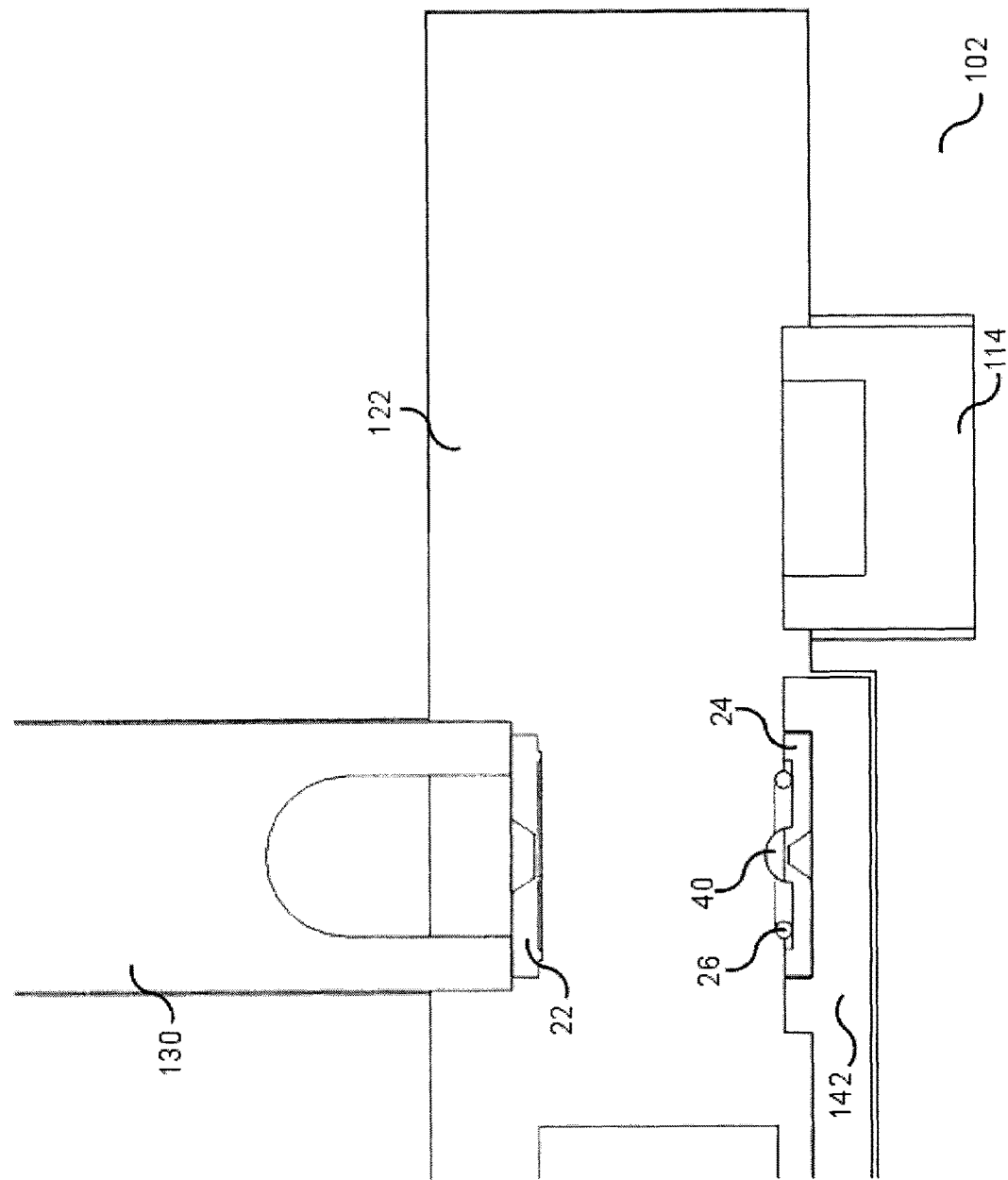
FIG. 29 is a view, similar to FIG. 16, of an alternate embodiment of the apparatus of FIG. 10.
Figure 42:
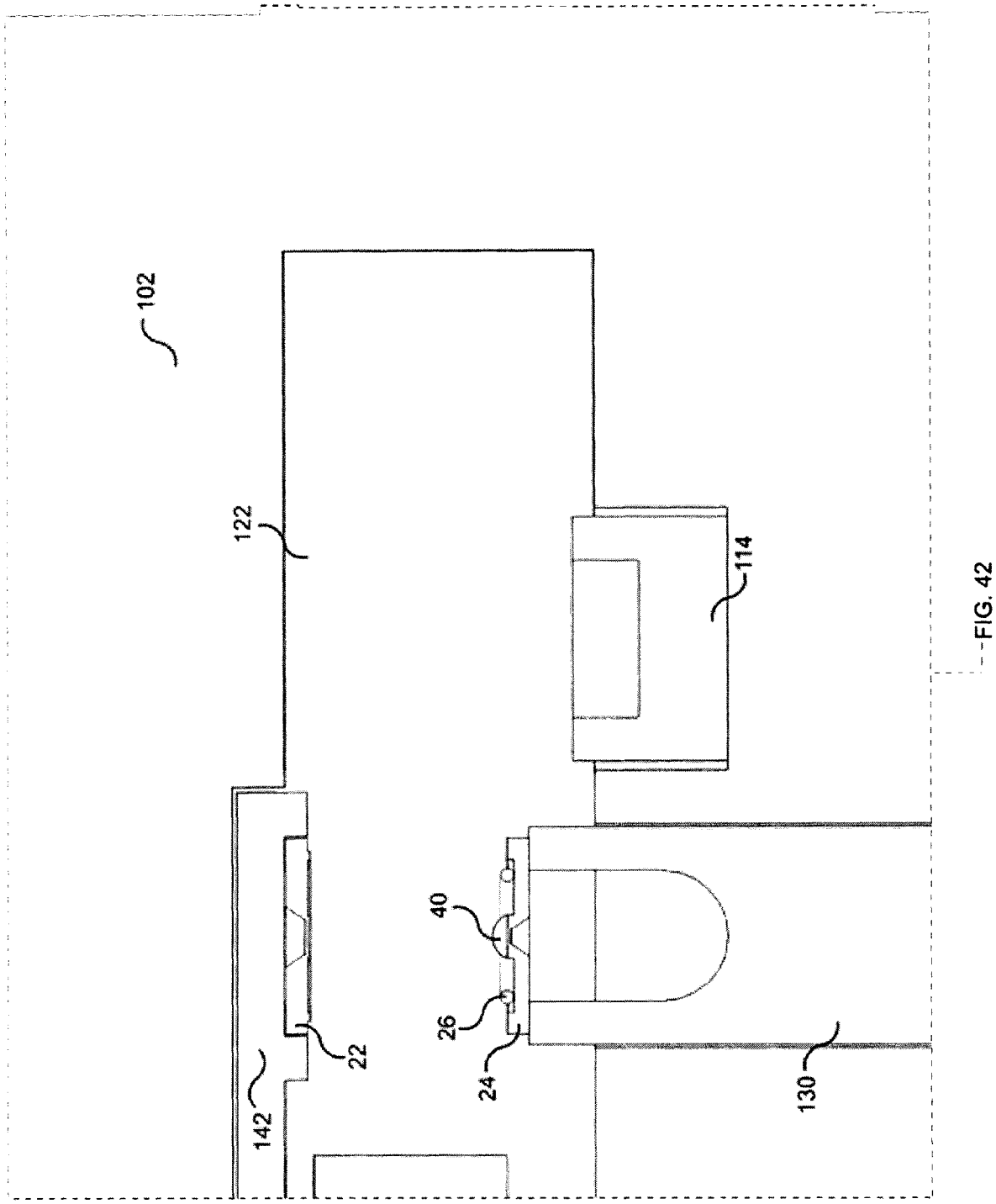
FIG. 42 is a view, similar to FIG. 16, of an alternate embodiment of the apparatus of FIG. 10.

As shown in FIG. 29, a holder tip 142 [for an electron microscope] could fit inside the housing with part 24 and seal 26 already loaded thereon. After droplet 40 is in place and the chamber is evacuated, part 22 could be brought into abutment with part 24. FIG. 42 shows another variation, wherein a holder tip 142 holds part 22 and wherein the part 24 and seal 26 with droplet 40 are brought into abutment with part 22 via arm 130.

Figure 8:
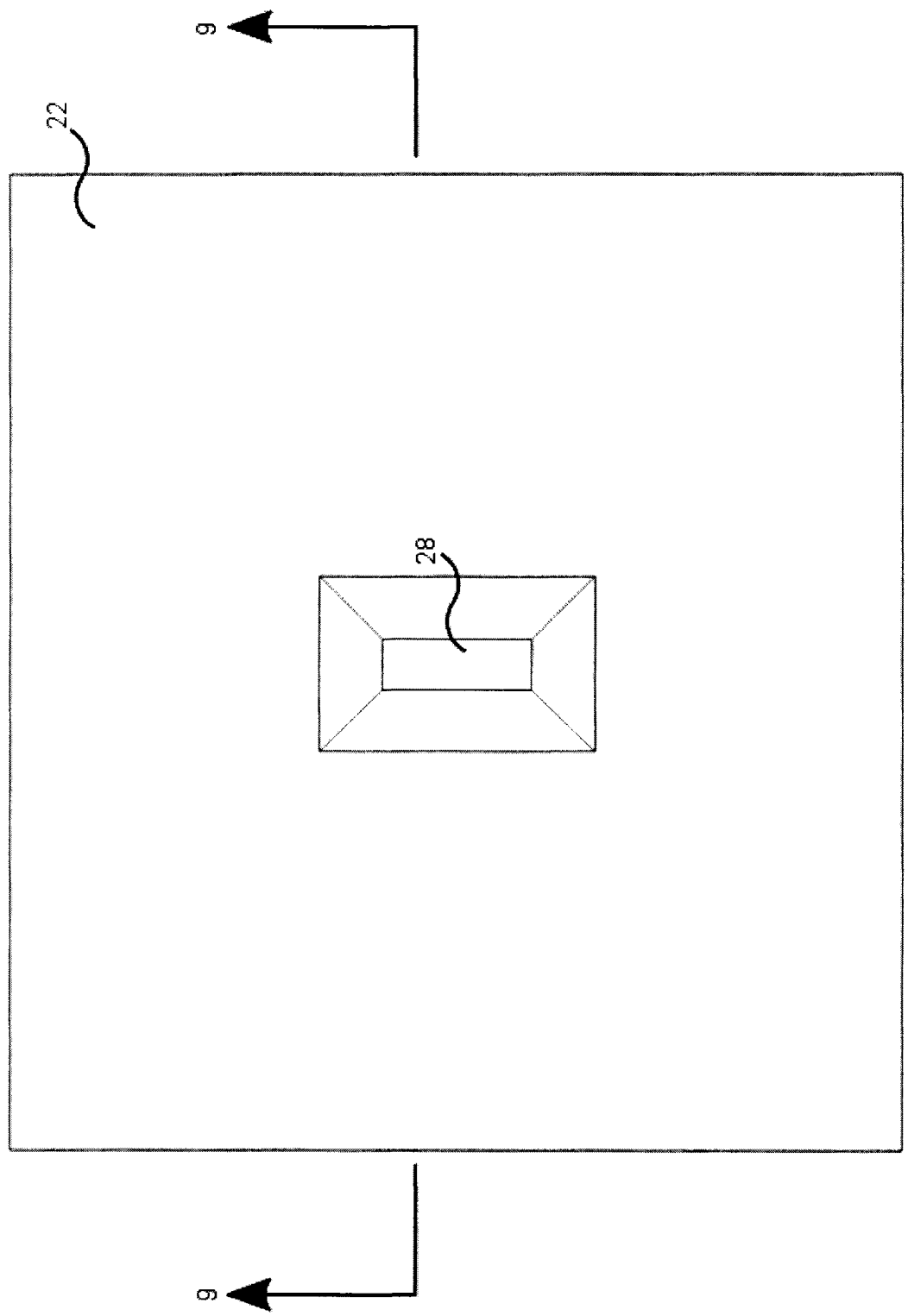
FIG. 8 is a top view of the structure of FIG. 6 assembled for use.
Figure 30:
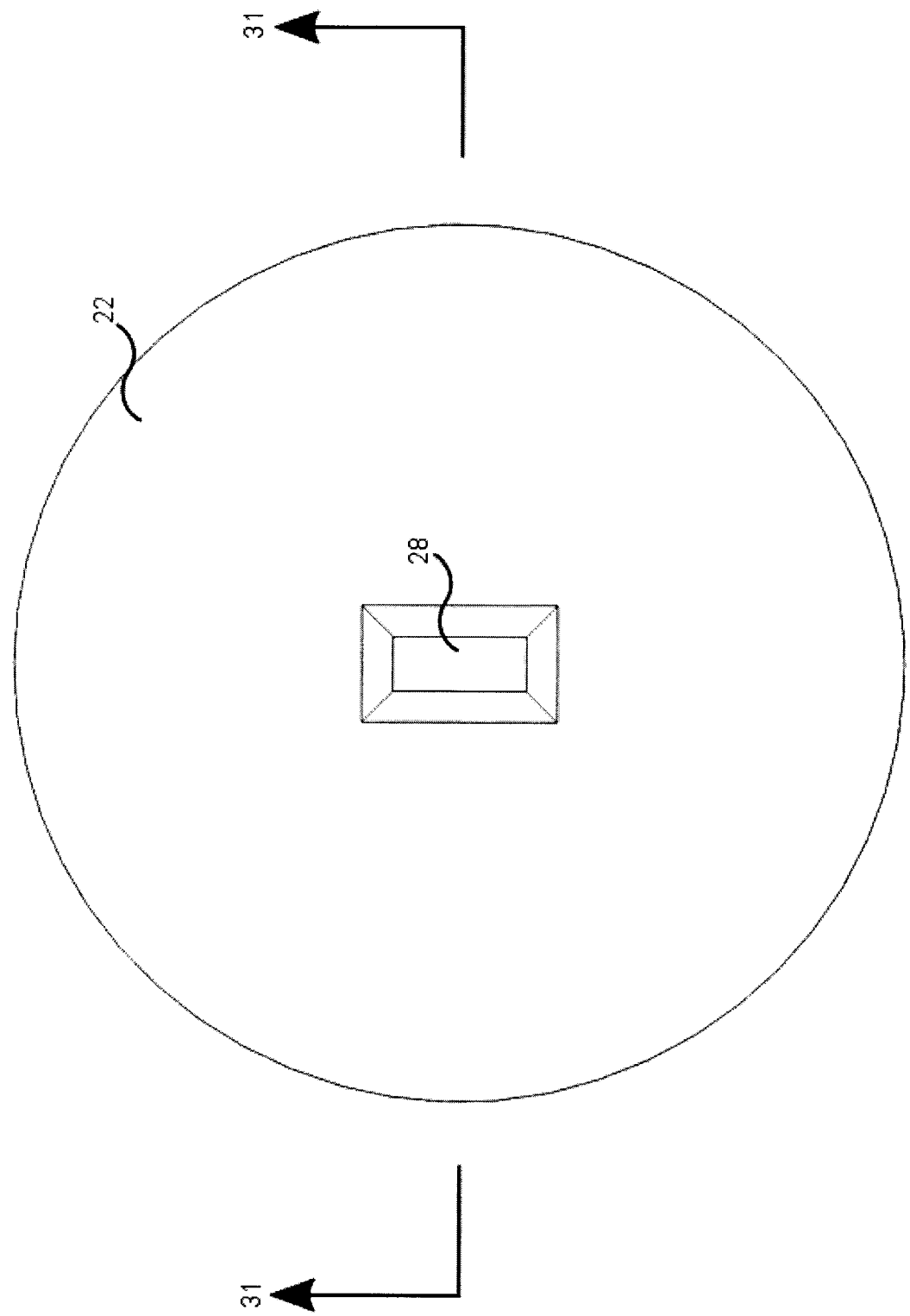
FIG. 30 is a top view, similar to FIG. 8, of an alternate embodiment of the structure of FIG. 8.
Figure 31:
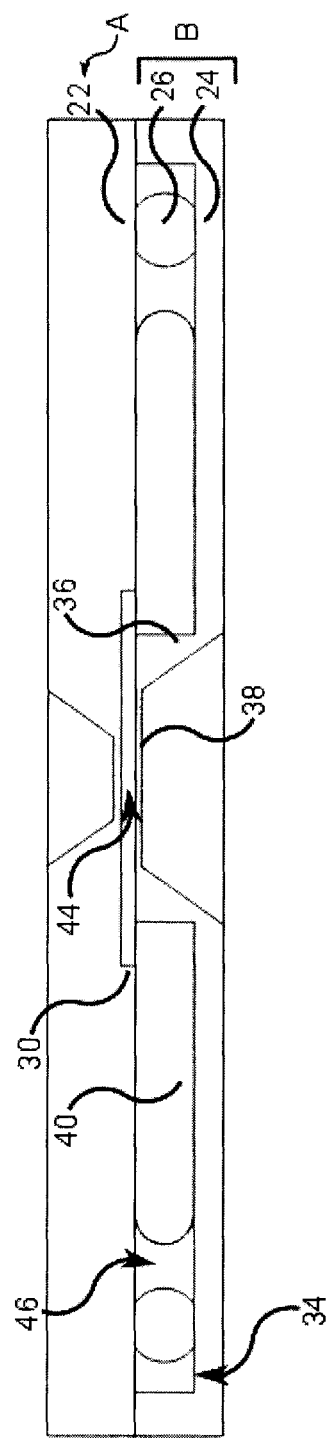
FIG. 31 is a view along 31-31 of FIG. 30.

FIG. 30 and FIG. 31 show another embodiment of the invention, similar to that shown in FIG. 8 and FIG. 9, but differing in that the cell is round and the spacer 30 extends to the periphery of the cell.

Figure 32:
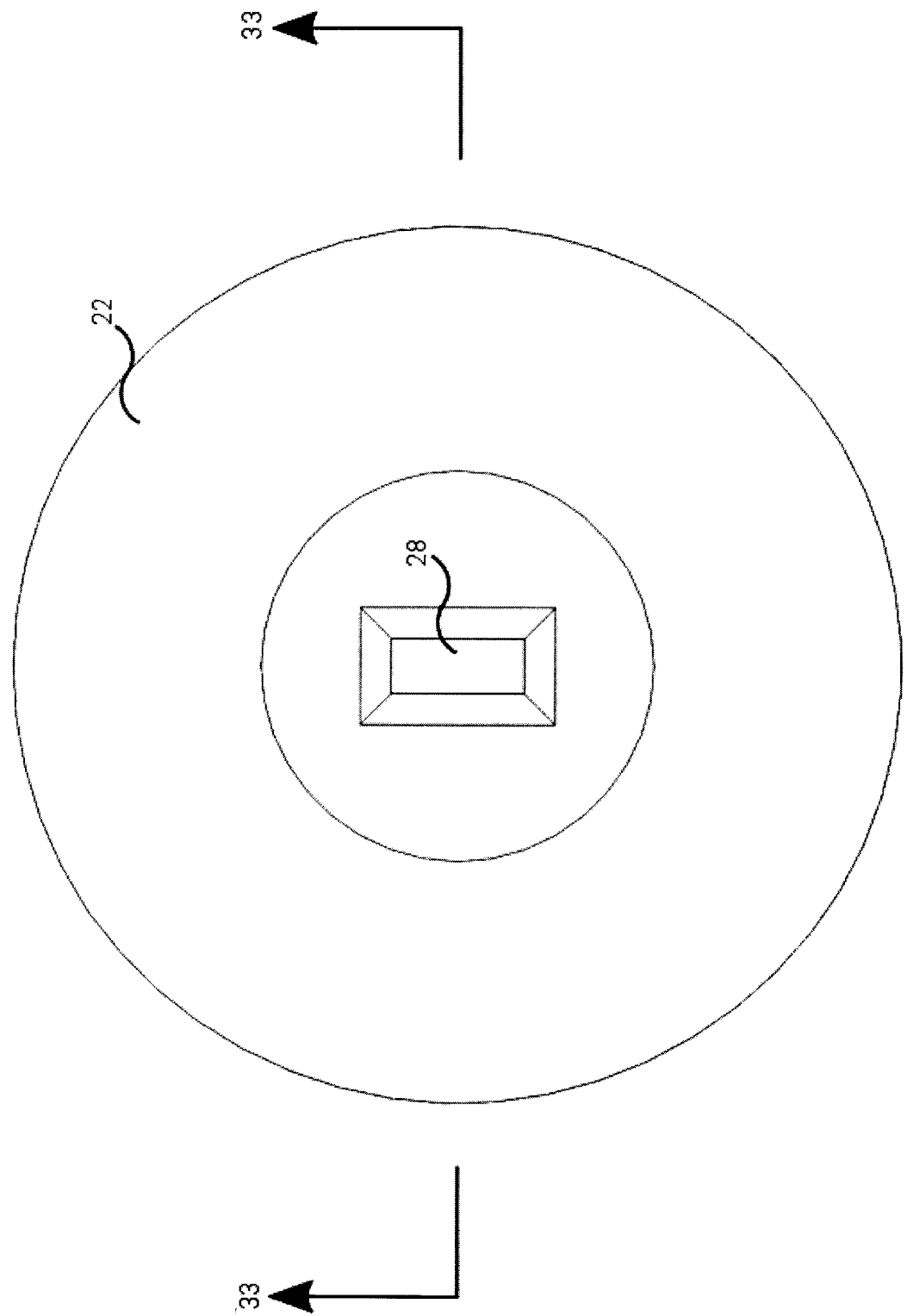
FIG. 32 is a top view, similar to FIG. 8, of an alternate embodiment of the structure of FIG. 8.
Figure 33:
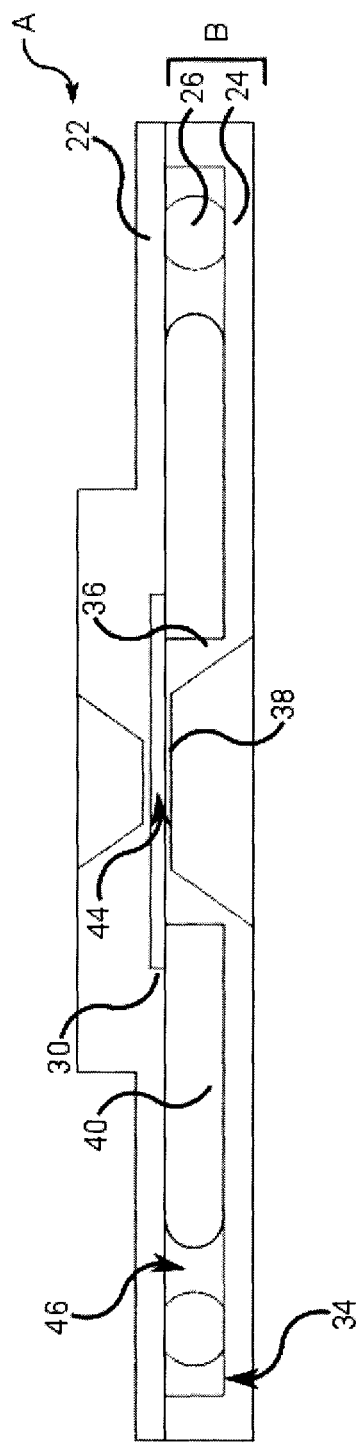
FIG. 33 is a view along 33-33 of FIG. 32.

FIG. 32 and FIG. 33 show another embodiment of the invention, similar to that shown in FIG. 8 and FIG. 9, but differing in that the cell is round and in that part 22 thereof has a stepped outer surface.

Figure 34:
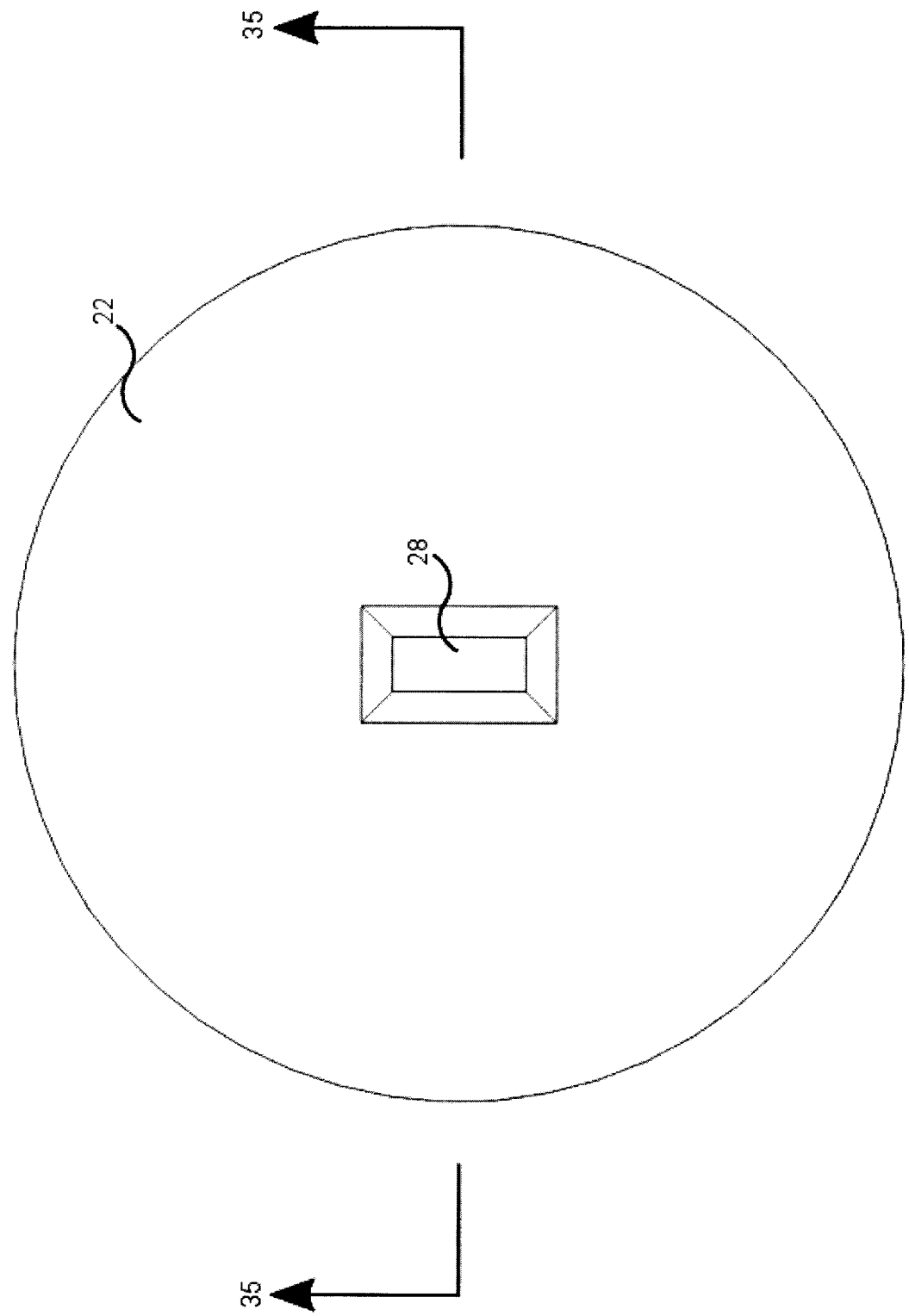
FIG. 34 is a top view, similar to FIG. 8, of an alternate embodiment of the structure of FIG. 8.
Figure 35:
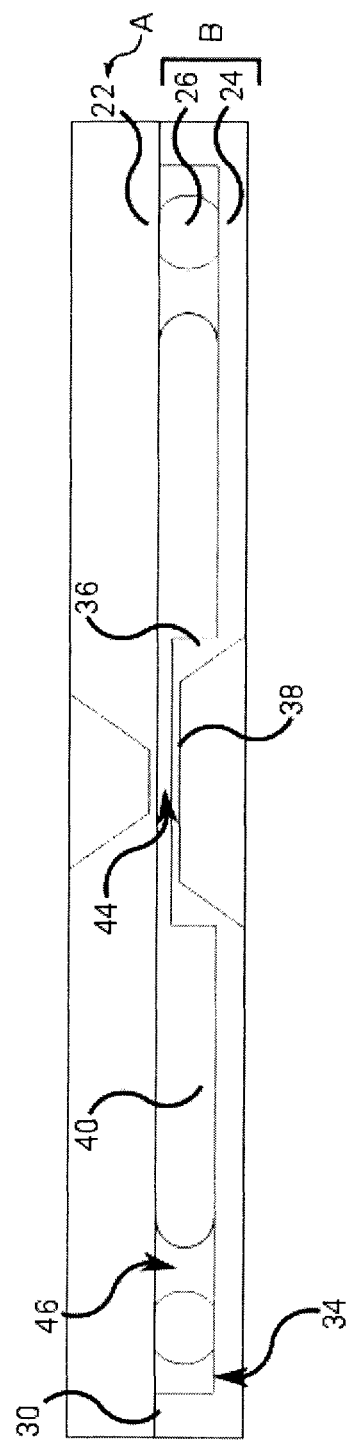
FIG. 35 is a view along 35-35 of FIG. 34.

FIG. 34 and FIG. 35 show another embodiment of the invention, similar to that shown in FIG. 8 and FIG. 9, but differing in that the cell is round and in that the spacer 30 is defined in part by etching of boss 36 of part 24.

Figure 36:
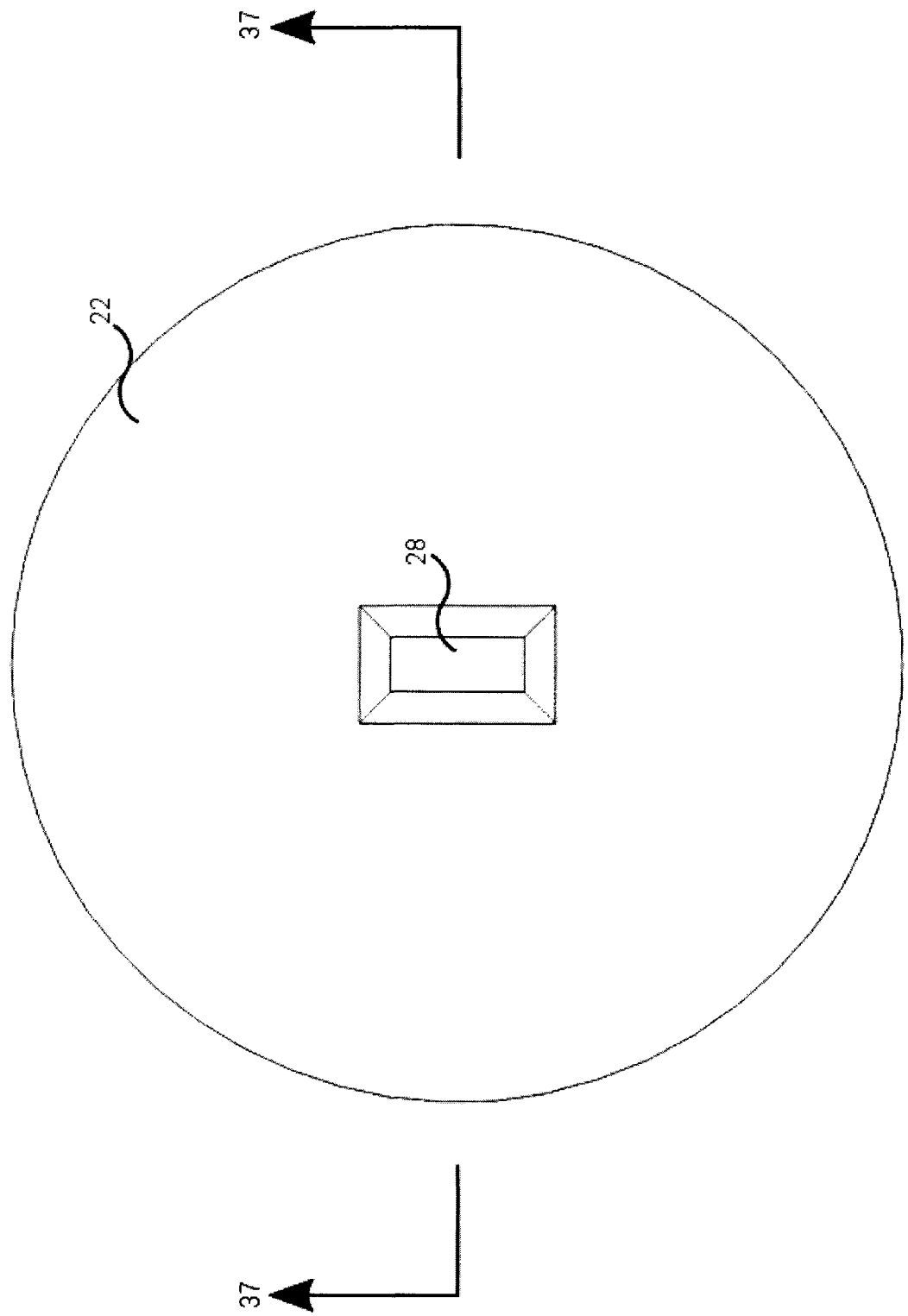
FIG. 36 is a top view, similar to FIG. 8, of an alternate embodiment of the structure of FIG. 8.
Figure 37:
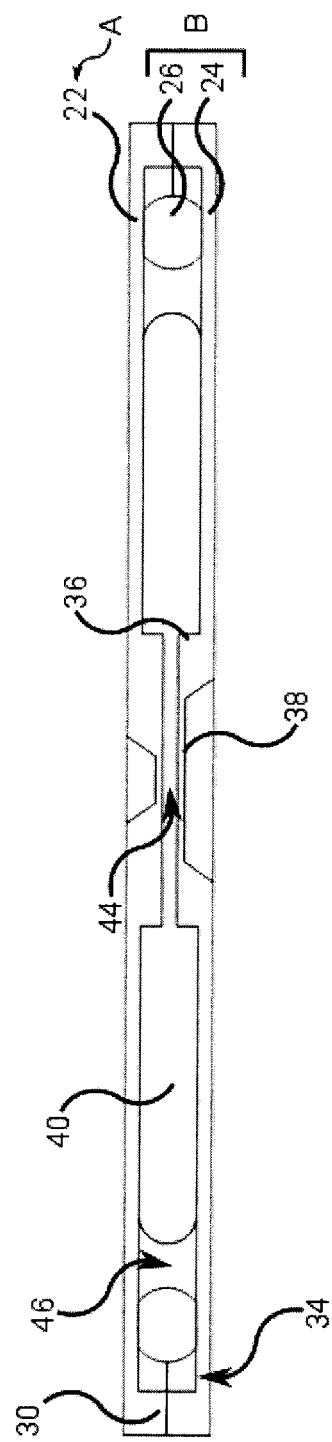
FIG. 37 is a view along 37-37 of FIG. 36.

FIG. 36 and FIG. 37 show another embodiment of the invention, similar to that shown in FIG. 8 and FIG. 9, but differing in that the cell is round, in that the cavity is defined in each of parts 22 and 24 and in that the spacer 30 is defined in part by etching of part 22 or etching of part 24 or parts 22 and 24.

Figure 38:
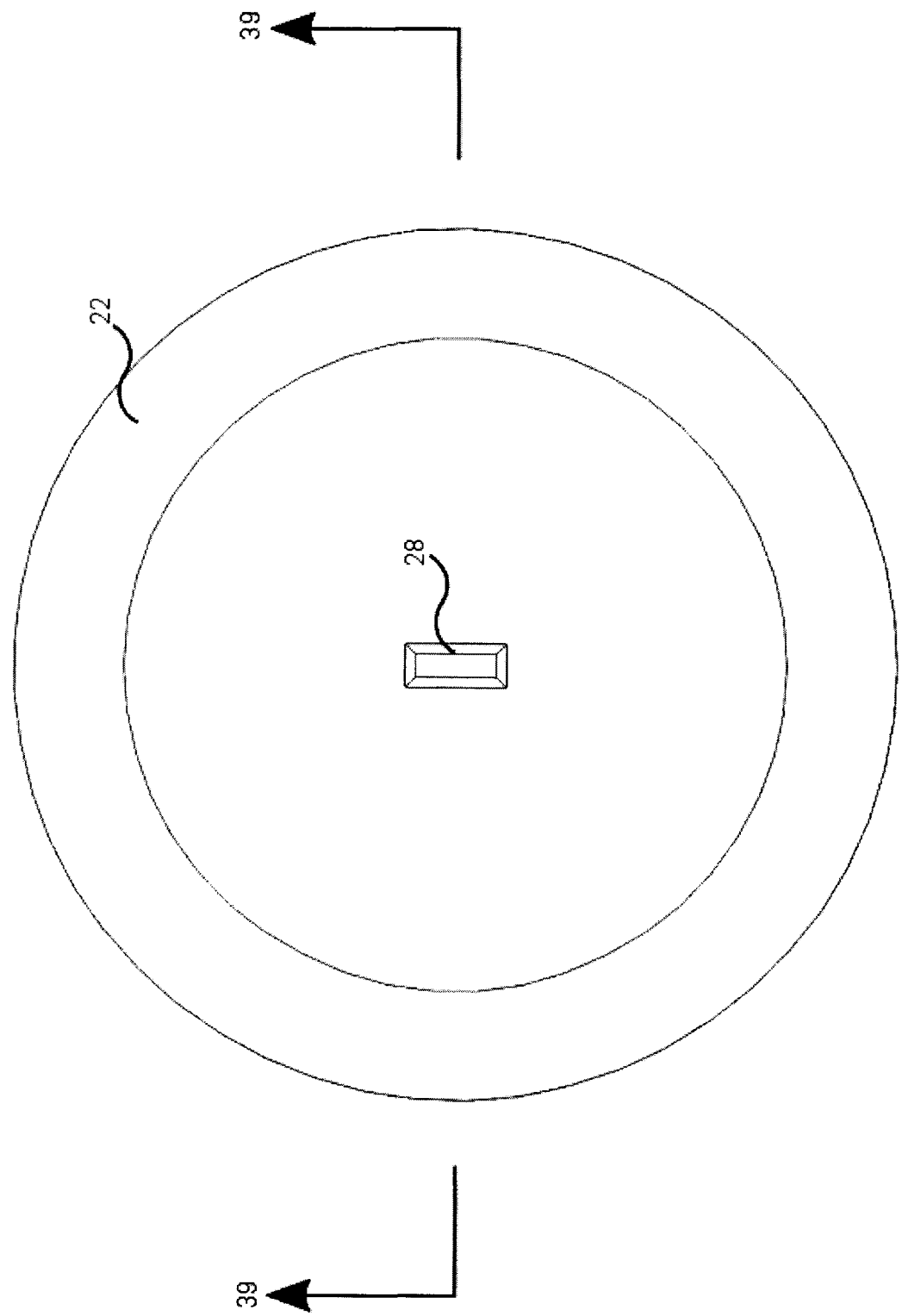
FIG. 38 is a top view, similar to FIG. 8, of an alternate embodiment of the structure of FIG. 8.
Figure 39:
FIG. 39 is a view along 39-39 of FIG. 38.

FIG. 38 and FIG. 39 show another embodiment of the invention, similar to that shown in FIG. 36 and FIG. 37, but differing in that the each of parts 22 and 24 has a stepped outer surface.

Figure 43:
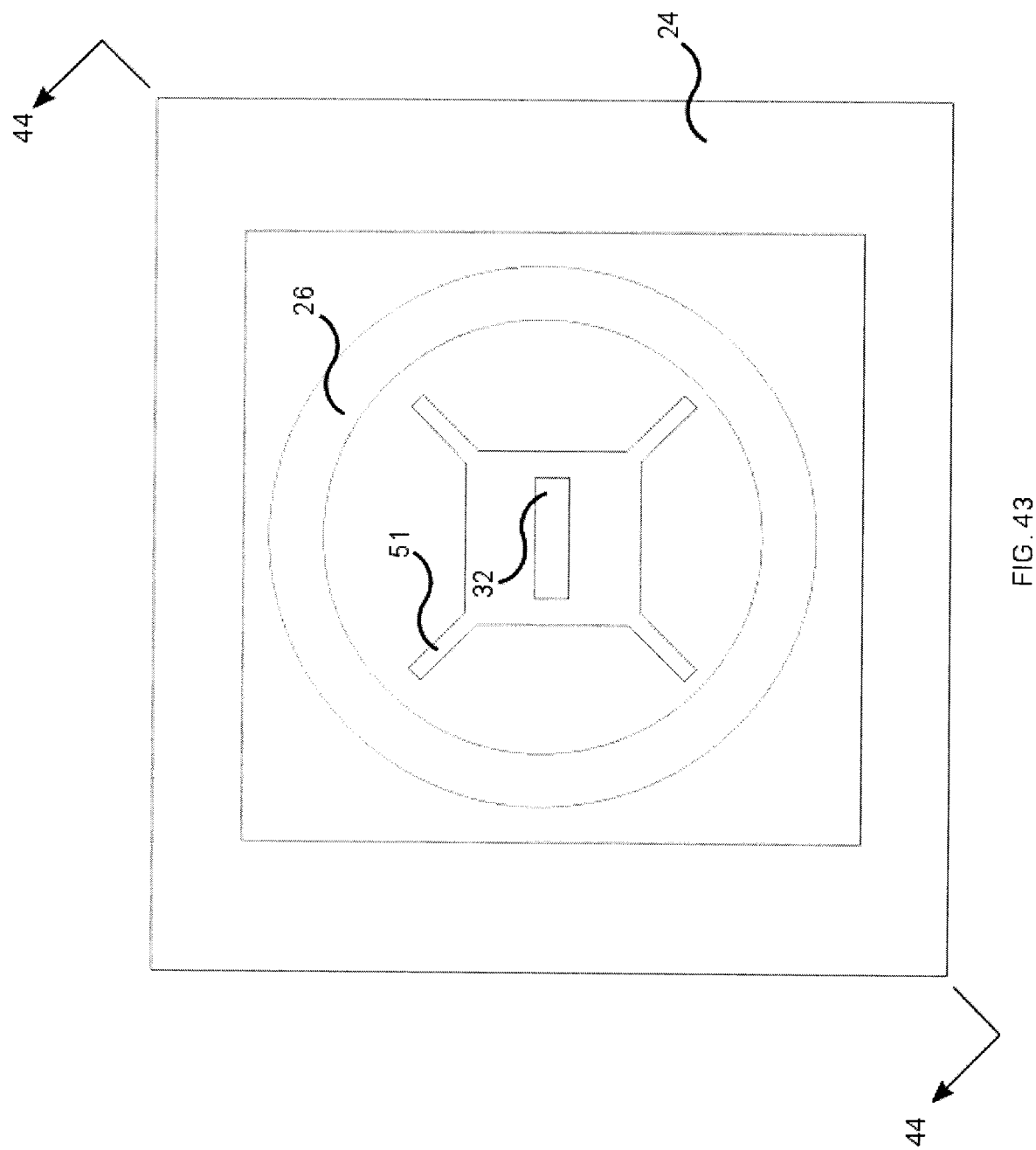
FIG. 43 is a view of another embodiment, this view being, to the alternate embodiment, akin to a top view of the encircled area 5 of FIG. 1.
Figure 44:
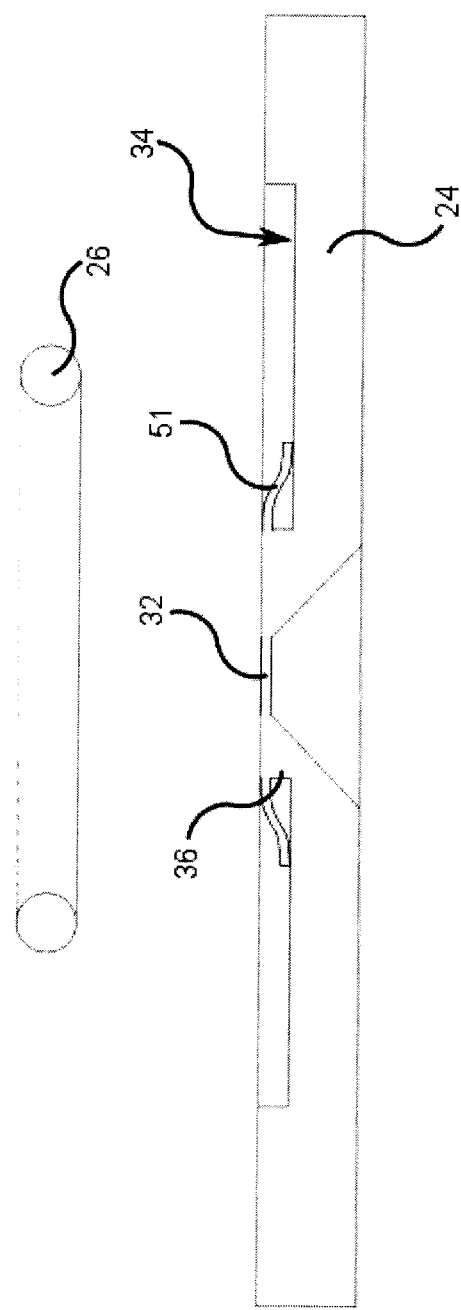
FIG. 44 is a view along 44-44 of FIG. 43.

FIG. 43 and FIG. 44 show another embodiment of the invention, similar to that shown in FIG. 1, but with wings 51 that extend beyond the boss 36, and make contact with the base of the recess 34. Wings can be made, for example, of the same material as the window.

Figure 40:
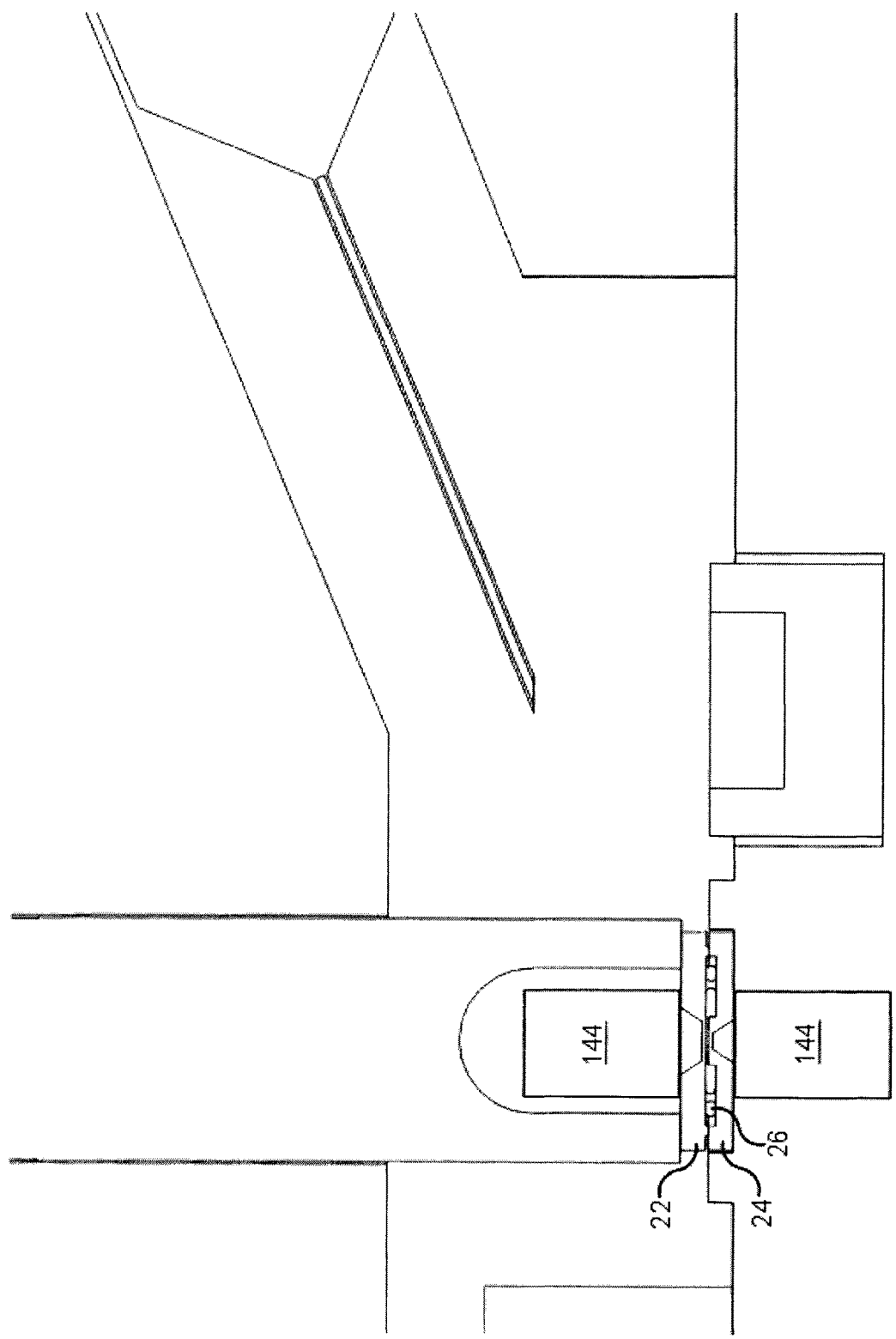
FIG. 40 is a view of another embodiment of the apparatus of FIG. 19.

Further, whereas, atmospheric pressure is indicated to hold the bodies together, this is not essential. FIG. 40 shows a variation of the structure shown in FIG. 19, wherein each of the receiver and the arm has a socket in receipt of a magnet 144. Persons of ordinary skill in the art will readily appreciate that the magnets can, for example, be releasably engaged by their respective sockets by set screws or the like, not shown, and released therefrom after the chip has been assembled, such that magnetic force urges the bodies together. This will enable the chip to be safely removed from the loading platform; the magnets can then be carefully removed, perhaps after the chip has been welded or adhesively secured together, or placed and secured into the electron microscope sample holder. The magnets could similarly be frictionally engaged by the sockets, the frictional engagement being such that the force of attraction between the magnets, once coupled to one another, is sufficient to ensure that the magnets dislodge from the sockets rather than from one another.

Figure 41:
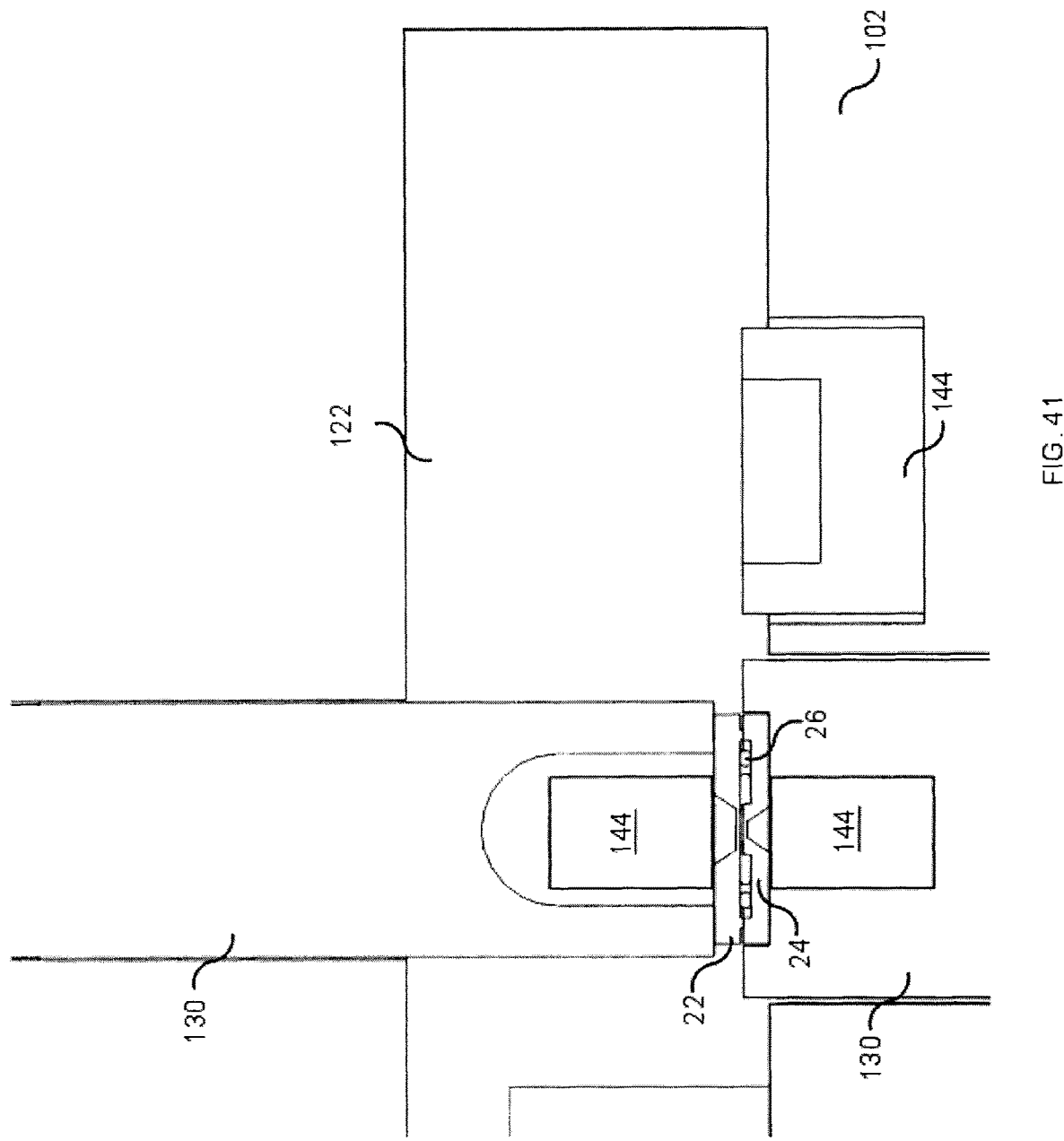
FIG. 41 is a view of another embodiment of the apparatus of FIG. 40.

FIG. 41 shows another variation of the structure of FIG. 40, wherein a pair of arms are provided, as in FIG. 28.

Yet further variations are possible. For example, only, whereas a droplet is occasionally mentioned, the sample could be of a liquid that does not form classical droplets. As well, whereas liquid is mentioned, it will be appreciated that the liquid could be a carrier for an in-liquid sample; the liquid need not itself be the sample. Similarly, whereas the drawings show, for example, a cell with a single window and a single boss, the cell could have multiple windows and multiple sample receiving areas; the platform could also load multiple cells. Further, whereas a vacuum pump is shown to define the evacuation apparatus, a syringe, for example, could be used.

Accordingly, the invention should be understood to be limited only by the accompanying claims, purposively construed.

The invention claimed is:

1. Apparatus for use with an electron microscope and for receiving a liquid sample droplet, the apparatus comprising:
   a pair of parts which, in use, are disposed in abutting relation to one another to define a cell for use with said microscope, the cell having: disposed on opposite surfaces thereof, a pair of windows, the windows being arranged in spaced relation to one another to define a viewable interior volume of the cell at the region of overlap; and a cavity communicating with the viewable interior volume of the cell, the cavity, in combination with the viewable interior volume, being larger than the volume of the droplet and sealed
   wherein each part of the pair is defined, at least in part, by a respective body, each body defining a respective one of the windows;

one of the bodies defines a surface in which the window of such body is defined; and the surface is one or more of the end of a boss and a surface having a high affinity for the liquid sample droplet.

2. Apparatus according to claim 1, wherein the pair of parts further comprises a compressible seal, the seal: being disposed between the bodies and in compression in the cell; and defining, in part, the cavity.

3. Apparatus according to claim 2, wherein the seal is an O-ring.

4. Apparatus according to claim 1, wherein the pair of parts further comprises a coating disposed on one or both of the bodies and sealing the bodies together to seal the cavity in use.

5. Apparatus according to claim 1, wherein each of the bodies terminates in a flat surface, the flat surfaces abutting one another in use to define a seal which seals the cavity in use.

6. Apparatus according to claim 1, wherein each body is a silicon body.

7. Apparatus according to claim 1, wherein each window is a high electron transparent window.

8. Apparatus for use with a pair of parts, a liquid sample droplet, a liquid and an evacuation apparatus for creating vacuum conditions, the pair of parts, in use, being disposed in abutting relation to one another to define a cell for use with an electron microscope, the apparatus comprising:

a housing having a receiver for one of the pair of parts, the receiver being adapted to hold the one of the pair of parts, the housing being adapted to define a chamber containing the receiver and further containing a reservoir for receiving the liquid, which chamber, in use, is evacuated by the evacuation apparatus; and an arrangement for, when the one of the parts is in the receiver and is in receipt of the sample droplet, the other of the parts is spaced apart from the one of the parts and the chamber has been evacuated by said evacuation apparatus and the liquid is in the reservoir, causing the one of the pair of parts to come into contact with the other of the pair of parts.

9. Apparatus according to claim 8, further comprising a mechanism for, when the one of the parts is in the receiver and the chamber has been evacuated, depositing said sample droplet on said one of the parts.

10. Apparatus according to claim 9, wherein the housing comprises:

a base defining the receiver; and a cover, the cover having, with the base, a closed configuration, wherein the cover is disposed in abutting, sealed relation to the base; and an open configuration, wherein the cover is disposed above and in spaced relation to the base, to permit placement of the one of the pair of parts in the receiver;

defining, when the one of the parts is in the receiver and the cover is in the closed configuration with the base, in combination with the base, the chamber.

11. Apparatus according to claim 10, wherein the mechanism comprises a needle mounted to the cover for movement between an extended position wherein a tip of the needle is positioned immediately above the one of the pair of parts to permit the sample droplet to be placed thereupon; and a retracted position wherein the tip of the needle is spaced from the one of the pair of the parts.

12. Apparatus according to claim 11, wherein the needle forms of a syringe mounted for reciprocation to the cover for movement between the extended position and the retracted position.

13. Apparatus according to claim 12, wherein the arrangement comprises a carrier adapted to releasably grip the other of the pair of parts and mounted to the housing for movement between:

a retracted position, vertically spaced above the one of the parts sufficiently to allow movement of the needle from the retracted position to the extended position; and an extended position, whereat the other of the parts is disposed in abutting relation to the one of the parts.

14. Apparatus according to claim 8, wherein the arrangement comprises a carrier in receipt of one of the pair of parts or the other of the pair of parts and mounted to the housing for movement between:

a retracted position, whereat the parts of the pair are disposed in vertically spaced relation to one another; and an extended position, whereat the parts of the pair are disposed in abutting relation to one another.

15. Apparatus according to claim 13 wherein the carrier is adapted to releasably grip the other of the pair of parts by a low-tack adhesive.

16. Apparatus according to claim 14 wherein the carrier is adapted to releasably grip the other of the pair of parts by a low-tack adhesive.

17. Apparatus according to claim 9 wherein the base and cover are transparent.

18. Apparatus for use with a pair of parts, a liquid and an evacuation apparatus, the pair of parts, in use, being disposed in abutting relation to one another to define a cell for use with an electron microscope, the apparatus comprising:

a housing being adapted to receive one of the pair of parts and further being adapted to define a chamber containing the one of the parts and a reservoir for the liquid, which chamber, in use, is evacuated by the evacuation apparatus; and an arrangement for, when the one of the parts is received by the housing, the other of the parts is spaced from the one of the parts, the liquid is in the reservoir and the chamber has been evacuated by said evacuation apparatus, causing the one of the pair of parts to come into contact with the other of the pair of parts.

* * * * *